(12) United States Patent
Li et al.

(10) Patent No.: US 12,476,213 B2
(45) Date of Patent: Nov. 18, 2025

(54) SEMICONDUCTOR PACKAGE AND METHOD OF MANUFACTURING

(71) Applicant: Taiwan Semiconductor Manufacturing Company, Ltd., Hsinchu (TW)

(72) Inventors: Chien Li, Taoyuan (TW); Chih-Ju Yen, New Taipei (TW); Jui Hsien Lo, New Taipei (TW); Chien-Sheng Chen, Hsinchu (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 550 days.

(21) Appl. No.: 17/806,311

(22) Filed: Jun. 10, 2022

(65) Prior Publication Data

US 2023/0402417 A1 Dec. 14, 2023

(51) Int. Cl.
*H01L 23/00* (2006.01)

(52) U.S. Cl.
CPC .............. *H01L 24/13* (2013.01); *H01L 24/97* (2013.01); *H01L 2224/11318* (2013.01); *H01L 2224/116* (2013.01); *H01L 2224/145* (2013.01); *H01L 2224/97* (2013.01)

(58) Field of Classification Search
None
See application file for complete search history.

(56) References Cited

U.S. PATENT DOCUMENTS

| 10,930,613 | B2* | 2/2021 | Park | H01L 23/3192 |
| 2003/0059978 | A1* | 3/2003 | Suzuki | H01L 24/29 |
| | | | | 257/E21.503 |
| 2005/0051885 | A1* | 3/2005 | Weng | H10D 62/117 |
| | | | | 257/E29.022 |
| 2008/0061312 | A1* | 3/2008 | Gao | H01L 24/73 |
| | | | | 257/99 |
| 2008/0081401 | A1* | 4/2008 | Shizuno | H01L 25/0655 |
| | | | | 257/E21.503 |
| 2009/0032974 | A1* | 2/2009 | Farooq | H01L 21/563 |
| | | | | 257/E21.59 |
| 2009/0283317 | A1* | 11/2009 | Ozawa | H01L 23/49838 |
| | | | | 174/267 |

(Continued)

*Primary Examiner* — Cory W Eskridge
(74) *Attorney, Agent, or Firm* — Harrity & Harrity, LLP

(57) ABSTRACT

Some implementations described herein provide a semiconductor package including an integrated circuit die mounted to an interposer using connection structures. An underfill material between the integrated circuit die and the interposer includes shaped fillets that are below a plane corresponding to a bottom surface of the integrated circuit die. The underfill material including the shaped fillets reduces a likelihood of stresses and/or strains that damage a mold compound from transferring to the mold compound from the underfill material, the integrated circuit die, and/or the interposer. In this way, a quality and reliability of the semiconductor package including the underfill material with the shaped fillets is reduced. By improving the quality and reliability of the semiconductor package, a yield of the semiconductor package may increase to decrease a cost of the semiconductor package.

20 Claims, 25 Drawing Sheets

(56) References Cited

U.S. PATENT DOCUMENTS

| | | | |
|---|---|---|---|
| 2012/0048607 A1* | 3/2012 | Takahashi | H01L 21/563 174/260 |
| 2013/0200529 A1* | 8/2013 | Lin | H01L 23/18 257/E23.116 |
| 2014/0049930 A1* | 2/2014 | Yamaguchi | H05K 13/0465 228/180.1 |
| 2017/0150875 A1* | 6/2017 | Shimizu | G02B 23/2484 |
| 2020/0350288 A1* | 11/2020 | Park | H01L 25/0657 |
| 2020/0365556 A1* | 11/2020 | Yamano | H01L 24/92 |
| 2022/0068839 A1* | 3/2022 | Ke | H01L 23/562 |
| 2022/0367413 A1* | 11/2022 | Huang | H01L 25/0655 |
| 2023/0061843 A1* | 3/2023 | Shih | H05K 1/181 |
| 2023/0307307 A1* | 9/2023 | Horibe | H01L 24/16 |
| 2023/0395479 A1* | 12/2023 | Juang | H01L 23/3135 |

* cited by examiner

SEMICONDUCTOR PACKAGE AND METHOD OF MANUFACTURING

BACKGROUND

A high-performance computing (HPC) semiconductor package may include one or more integrated circuit (IC) dies, or chips, from a semiconductor wafer, such as a system-on-chip (SoC) IC die, a dynamic random access memory (DRAM) IC die, or a high bandwidth memory (HBM) IC die. The HPC semiconductor package may include an interposer that provides an interface between the one or more IC dies and a substrate. The HPC semiconductor package may further include one or more connection structures to provide electrical connectivity for signaling between the one or more IC dies, the interposer, and the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
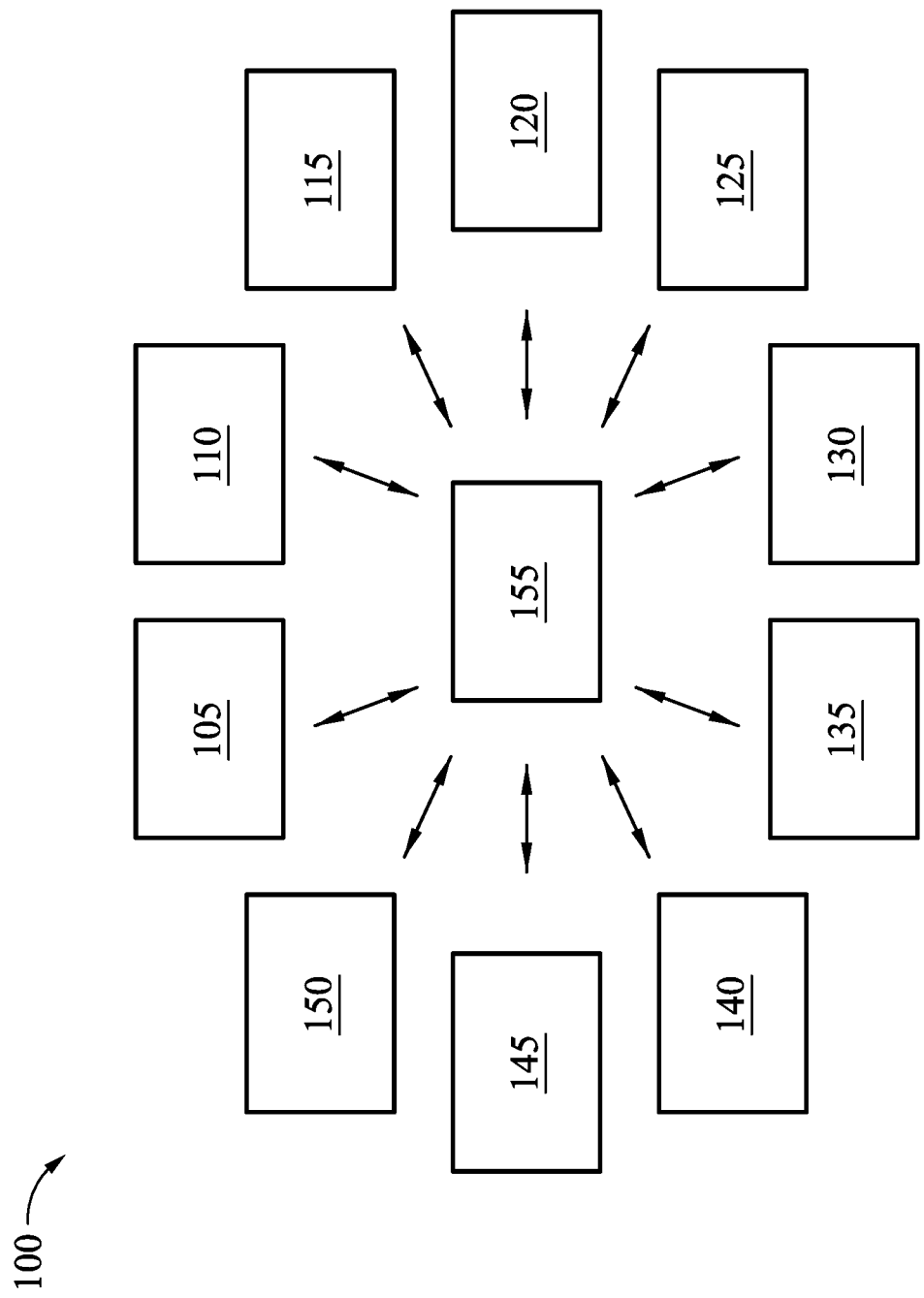
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package, such as an HPC semiconductor package, includes an IC die mounted to a top surface of an interposer using connection structures. An underfill material may surround the connection structures and fill gaps between a bottom surface of the IC die and the top surface of the interposer. The underfill material may absorb stresses and strains resulting from a load condition such as a shock load condition, a drop load condition, a vibration load condition, or a thermal load condition resulting from a mismatch of coefficients of thermal expansion (CTE) between the IC die and the interposer. By absorbing the stresses and strains, the underfill material may protect the reliability of electrical connections (e.g., solder joints) made by connection structures.

The underfill material includes a fillet having a portion that extends beyond a perimeter, and above, a bottom surface of the IC die. A portion of the fillet may interface with a mold compound encapsulating the IC die and, under one or more of the aforementioned load conditions, cause a transfer of stresses and strains from the underfill material, the IC die, and/or the interposer to the mold compound. The transfer of the stresses and strains to the mold compound may cause the mold compound to crack, decreasing a reliability and a quality of the semiconductor package.

Some implementations described herein provide a semiconductor package including an IC die mounted to an interposer using connection structures. An underfill material between the IC die and the interposer includes shaped fillets that are below a plane corresponding to a bottom surface of the IC die. The underfill material including the shaped fillets, that are below the plane corresponding to the bottom surface of the IC die, reduces a likelihood of stresses and/or strains that damage the mold compound from transferring to the mold compound from the underfill material, the IC die, and/or the interposer.

In this way, a quality and reliability of the semiconductor package including the underfill material with the shaped fillets is reduced. By improving the quality and reliability of the semiconductor package, a yield of the semiconductor package may increase, which decreases a cost of the semiconductor package. Additionally, a qualification of the semiconductor package may be expedited to increase a market share of product including the semiconductor package.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a series of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a series of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical interconnect access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, a spin coating tool, and/or a plating tool, among other examples). The RDL tool set 105 may further include a bonding/debonding tool for joining, and/or separating, semiconductor substrates (e.g., semiconductor wafers). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool, a grinding tool, a lapping tool, and a taping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor package. The connection structures formed by the connection tool set 115 may include a wire, a stud, a pillar, a bump, or a solderball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wirebond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor package (e.g., the one or more IC dies after encapsulation). The ATE tool set 120 may perform wafer testing operations, known good die (KGD) testing operations, semiconductor package testing operations, or system-level (e.g., a circuit board populated with one or more semiconductor packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor package from a leadframe. Additionally, or alternatively, the singulation tool set 125 may include a router tool or a laser tool that removes the semiconductor package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies to the interposer, the leadframe, and/or the strip of the organic substrate material, among other examples. The die-attach tool set 130 may include a pick-and-place tool, a taping tool, a laminating tool, a reflow tool (e.g., a furnace), a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density interconnect (HDI) PCB, among other examples. In some implementations, the PCB tool set 140 forms the interposer and/or the substrate. The PCB tool set 140 may include a laminating tool, a plating tool, a photoengraving tool, a laser cutting tool, a pick-and-place tool, an etching tool, a dispense tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform a series of operations. For example, and as described in greater detail in connection with FIGS. 3-8 and elsewhere herein, the series of operations includes attaching an IC die to an interposer using a set of connection structures. The series of operations includes forming an underfill pattern between the IC die and the interposer including a concave-shaped fillet, where the concave-shaped fillet is completely below a plane corresponding to a bottom surface of the IC die. The series of operations includes forming a mold compound over the IC die, the interposer, and the underfill pattern.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2:
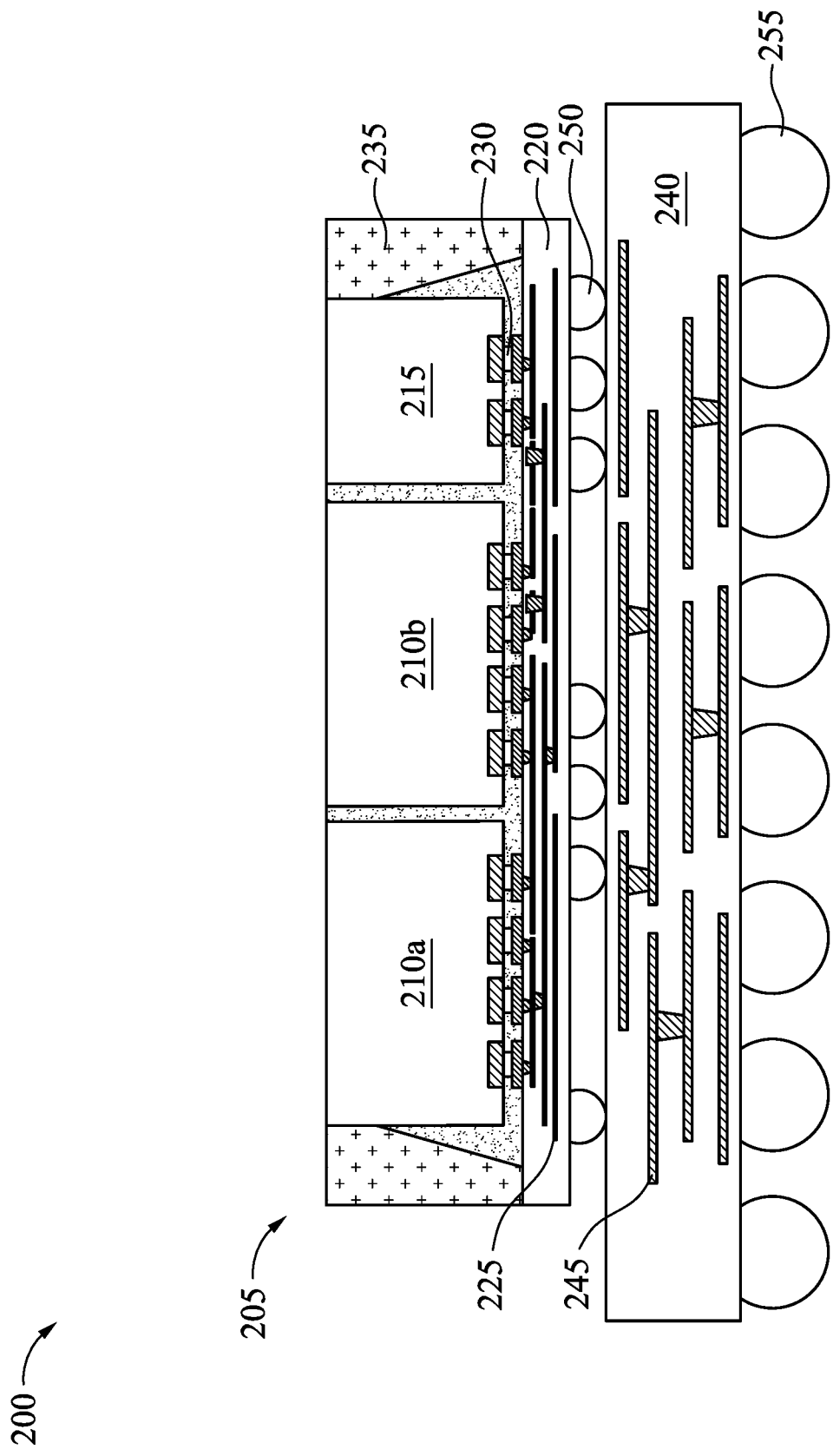
FIG. 2 is a diagram of an example implementation of a semiconductor package described herein.

FIG. 2 is a diagram of an example implementation 200 of a semiconductor package 205 described herein. In some implementations, the semiconductor package 205 corresponds to a high-performance computing (HPC) semiconductor package. Furthermore, FIG. 2 represents a side view of the of the semiconductor package 205.

The semiconductor package 205 may include one or more IC dies (e.g., a system-on-chip (SoC) IC die 210 and/or a dynamic random access memory (DRAM) IC die 215, among other examples). The semiconductor package 205 may include an interposer 220 having one or more layers of electrically-conductive traces 225. The interposer 220 may include one or more layers of a dielectric material, such as a ceramic material or a silicon material. In some implementations, the interposer 220 corresponds to a PCB including layers of a glass-reinforced epoxy laminate material and/or a pre-preg material (e.g., a composite fiber/resin/epoxy material), among other examples. Additionally, or alternatively, one or more layers of the interposer 220 may include a buildup film material.

The electrically-conductive traces 225 may include one or more materials such as a gold (Au) material, a copper (Cu) material, a silver (Ag) material, a nickel (Ni) material, a tin (Sn) material, or a palladium (Pd) material, among other examples. In some implementations, the interposer 220 includes one or more conductive vertical access connection structures (vias) that connect one or more layers of the electrically-conductive traces 225.

As shown in FIG. 2, the SoC IC die 210 and the DRAM IC die 215 are connected (e.g., mounted) to the interposer 220 using a plurality of connection structures 230. The connection structures 230 may include one or more combinations of a stud, a pillar, a bump, or a solderball, among other examples. The connection structures 230 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 230 may connect lands (e.g., pads) on bottom surfaces of the SoC IC die 210 and the DRAM IC die 215 to lands on a top surface of the interposer 220. In some implementations, the connection structures 230 may include one or more electrical connections for signaling (e.g., corresponding lands of the SoC IC die 210, the DRAM IC die 215, and the interposer 220 are electrically connected to respective circuitry and/or traces of the SoC IC die 210, the DRAM IC die 215, and the interposer 220).

In some implementations, the connection structures 230 may include one or more mechanical connections for attachment purposes and/or spacing purposes (e.g., corresponding lands of the SoC IC die 210, the DRAM IC die 215, and the interposer 220 are not electrically connected to respective circuitry and/or traces of the SoC IC die 210, the DRAM IC die 215, and the interposer 220). In some implementations, one or more of the connection structures 230 may function both electrically and mechanically.

A mold compound 235 may encapsulate one or more portions of the semiconductor package 205, including portions of the SoC IC die 210 and/or the DRAM IC die 215. The mold compound 235 (e.g., a plastic mold compound, among other examples) may protect the SoC IC die 210 and/or the DRAM IC die 215 from damage during manufacturing of the semiconductor package 205 and/or during field use of the semiconductor package 205.

The semiconductor package 205 may include a substrate 240 having one or more layers of electrically-conductive traces 245. The substrate 240 may include one or more layers of a dielectric material, such as a ceramic material or a silicon material. In some implementations, the substrate 240 corresponds to a PCB including layers of a glass-reinforced epoxy laminate material and/or a pre-preg material (e.g., a composite fiber/resin/epoxy material), among other examples. Additionally, or alternatively, one or more layers of the substrate 240 may include a buildup film material.

The electrically-conductive traces 245 may include one or more materials such as a gold (Au) material, a copper (Cu) material, a silver (Ag) material, a nickel (Ni) material, a tin (Sn) material, or a palladium (Pd) material, among other examples. In some implementations, the substrate 240 includes one or more conductive vertical access connection structures (vias) that connect one or more layers of the electrically-conductive traces 245.

As shown in FIG. 2, the interposer 220 is connected (e.g., mounted) to the substrate 240 using a plurality of connection structures 250. The connection structures 250 may include one or more combinations of a stud, a pillar, a bump, or a solderball, among other examples. In some implementations, the connection structures 250 correspond to controlled collapse chip connection (C4) connection structures. The connection structures 250 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 250 may connect lands (e.g., pads) on a bottom surface of the interposer 220 to lands on a top surface of the substrate 240. In some implementations, the connection structures 250 may include one or more electrical connections for signaling (e.g., corresponding lands of the interposer 220 and the substrate 240 are electrically connected to respective circuitry and/or traces of the interposer 220 and the substrate 240). In some implementations, the connection structures 250 may include or more mechanical connections for attachment purposes and/or spacing purposes (e.g., corresponding lands of the interposer 220 and the substrate 240 are not electrically connected to respective circuitry and/or traces of the interposer 220 and the substrate 240). In some implementations, one or more of the connection structures 250 may function both electrically and mechanically.

The semiconductor package 205 may include a plurality of connection structures 255 connected to lands (e.g., pads) on a bottom surface of the substrate 240. The connection structures 255 may include one or more combinations of a stud, a pillar, a bump, or a solderball, among other examples. The connection structures 255 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free). In some implementations, the connection structures 255 correspond to C4 connection structures.

The connection structures 255 may be used to attach the semiconductor package 205 (e.g., the substrate 240) to a circuit board (not shown) using a surface mount (SMT) process. In some implementations, the connection structures 255 may provide an electrical connection for signaling (e.g., corresponding lands of the substrate 240 and the circuit board may be electrically connected to respective circuitry and/or traces of the substrate 240 and the circuit board). In some implementations, the connection structures 250 may provide a mechanical connection to the circuit board for attachment purposes and/or spacing purposes (e.g., corresponding lands of the substrate 240 and the circuit board may not be electrically connected to respective circuitry and/or traces of the substrate 240 and the circuit board). In some implementations, one or more of the connection structures 250 may provide both mechanical and electrical connections.

As described in greater detail in connection with FIGS. 3-5E, and elsewhere herein, the semiconductor package 205 includes an interposer (e.g., the interposer 220) having a top surface. The semiconductor package 205 includes an IC die (e.g., the SoC IC die 210, among other examples) mounted to the interposer using connection structures (e.g., the connection structures 230). An underfill material between the IC die and the interposer includes shaped fillets that are below a plane corresponding to a bottom surface of the IC die. The underfill material including the shaped fillets reduces a likelihood of stresses and/or strains that damage the mold compound (e.g., the mold compound 235) from transferring to the mold compound from the underfill material, the IC die, and/or the interposer.

Additionally, or alternatively, a structure of the semiconductor package 205 includes an interposer (e.g., the interposer 220). The structure includes a first IC die (e.g., a first instance of the SoC IC die 210, among other examples) and a second IC die (e.g., a second instance of the SoC IC die 210, among other examples) adjacent to one another on the interposer and having edges that form an approximately rectangular perimeter. The structure includes a pattern of an underfill material including segments of shaped fillets along the approximately rectangular perimeter. In some implementations, the segments of the shaped fillets include portions that protrude beyond the approximately rectangular perimeter. In some implementations, the segments of the shaped fillets include top surfaces that are at or below a first plane corresponding to a bottom surface of the first IC die and a second plane corresponding to a bottom surface of the second IC die. In some implementations, the segments of the shaped fillets exclude top surfaces that are above the first plane corresponding to the bottom surface of the first IC die and the second plane corresponding to the bottom surface of the second IC die.

As indicated above, FIG. 2 is provided as an example. Other examples may differ from what is described with regard to FIG. 2.

Figure 3:
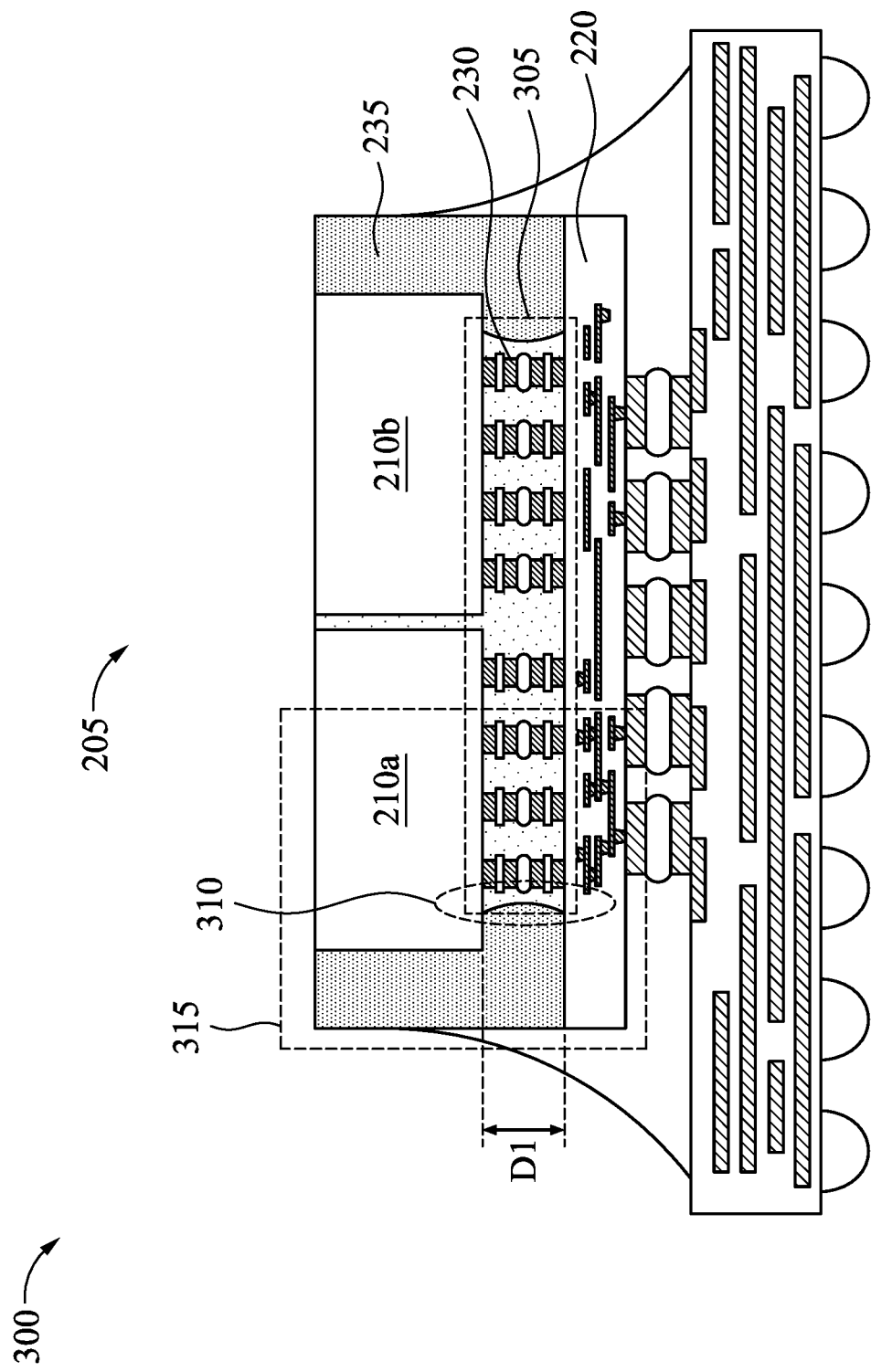
FIGS. 3, 4A-4C, 5A-5E, and 6A-6L are diagrams of example implementations described herein.

FIG. 3 is a diagram of an example implementation 300 described herein. Example implementation 300 may include the semiconductor package 205 formed using a combination of operations performed by one or more of the semiconductor processing tools 105-150 as described in connection with FIG. 1. Furthermore, FIG. 3 represents a side view of the semiconductor package 205. As shown in FIG. 3, the semiconductor package 205 includes two IC dies (e.g., the SoC IC die 210a and the SoC IC die 210b).

As shown in FIG. 3, the semiconductor package 205 includes a pattern of underfill material 305 between the two IC dies and the interposer 220. The pattern of underfill material 305 surrounds the connection structures 230 to improve a robustness of solder joints between the connection structures 230 and the interposer 220 during a qualification and/or a field use of the semiconductor package 205.

The pattern of underfill material 305 may include an epoxy polymer underfill material, among other examples. In some implementations, the pattern of underfill material 305 includes one or more mechanical properties. As an example, the pattern of underfill material 305 may include an underfill material that, in cured form, possesses a coefficient of thermal expansion (CTE) that is included in a range of approximately 10 microns per meter Kelvin (μ/m K) to approximately 50 μ/m K. If the CTE is less than approximately 10 μ/m K, the pattern of underfill material 305 may "under expand" during thermal cycling of a qualification process to introduce lateral stresses (e.g., compressive shear stresses) that damage the semiconductor package 205 and/or the connection structures 230. If the CTE is greater than approximately 50 μ/m K, the pattern of underfill material 305 may "over expand" during the thermal cycling and introduce opposite lateral stresses (e.g., tensile shear stresses) that damage the semiconductor package 205 and/or the connection structures 230. However, other values and ranges for the CTE of underfill material included in the pattern of underfill material 305 are within the scope of the present disclosure.

Additionally, or alternatively, the pattern of underfill material 305 may include an underfill material that, in cured form, possesses a Young's modulus that is included in a range of approximately 1 gigapascal (GPa) to approximately 20 GPa. If the Young's modulus is less than approximately 1 GPa, the pattern of underfill material 305 may be too elastic and not provide a robustness to enable the semiconductor package 205 and/or the connection structures 230 to withstand the thermal cycling. Conversely, if the Young's module is greater than approximately 20 GPa, the pattern of underfill material 305 may be too rigid and cause damage to the semiconductor package 205 and/or the connection structures 230 during the thermal cycling. However, other values and ranges for the Young's modulus of the underfill material included in the pattern of underfill material 305 are within the scope of the present disclosure.

The pattern of underfill material 305 may include a shaped fillet 310 located near an edge region 315 of at least one of the two IC dies. In some implementations, and as shown in FIG. 3, a profile of the shaped fillet 310 may correspond to a concave-shaped profile that extends inwards towards the connection structures 230. Additionally, or alternatively, a profile of the shaped fillet 310 may correspond to another shape, such as a triangular-shaped profile among other examples. In some implementations, the shape of the shaped fillet 310 (e.g., the concave-shape or the triangular shape, among other examples) provides a stress and a strain relief within the edge region 315 that reduces an amount of force transferred to the mold compound 235 during a qualification process of the semiconductor package 205 and/or a field use of the semiconductor package 205. By reducing the amount of force transferred to the mold compound 235, a likelihood of damage (e.g., cracking) to the mold compound 235 may be reduced to improve a quality and a reliability of the semiconductor package 205.

The shaped fillet 310 may include a height D1 that is lesser than or equal to a distance between the bottom surface of the IC dies and a top surface of the interposer 220. In other words, the shaped fillet 310 includes a top surface that is below a plane corresponding to bottom surfaces of the IC dies (e.g., completely below the IC dies). In some implementations, the height D1 is included in a range of up to approximately 100 microns (μm). However, other values and ranges for the height D1 are within the scope of the present disclosure.

The shaped fillet 310 may reduce a strain of the pattern of underfill material 305 in a vertical direction during the qualification process of the semiconductor package 205 and/or during the field use of the semiconductor package 205. By reducing the strain of the pattern of underfill material 305 in the vertical direction, a likelihood of damage (e.g., cracking) to the mold compound 235 may be reduced to improve the quality and/or the reliability of the semiconductor package 205.

As indicated above, FIG. 3 is provided as an example. Furthermore, and described in connection with FIGS. 4A-5E and elsewhere herein, there may be different shapes, features, and/or patterns associated with the shaped fillet 310 than those shown or described in connection with FIG. 3.

Figure 4A:
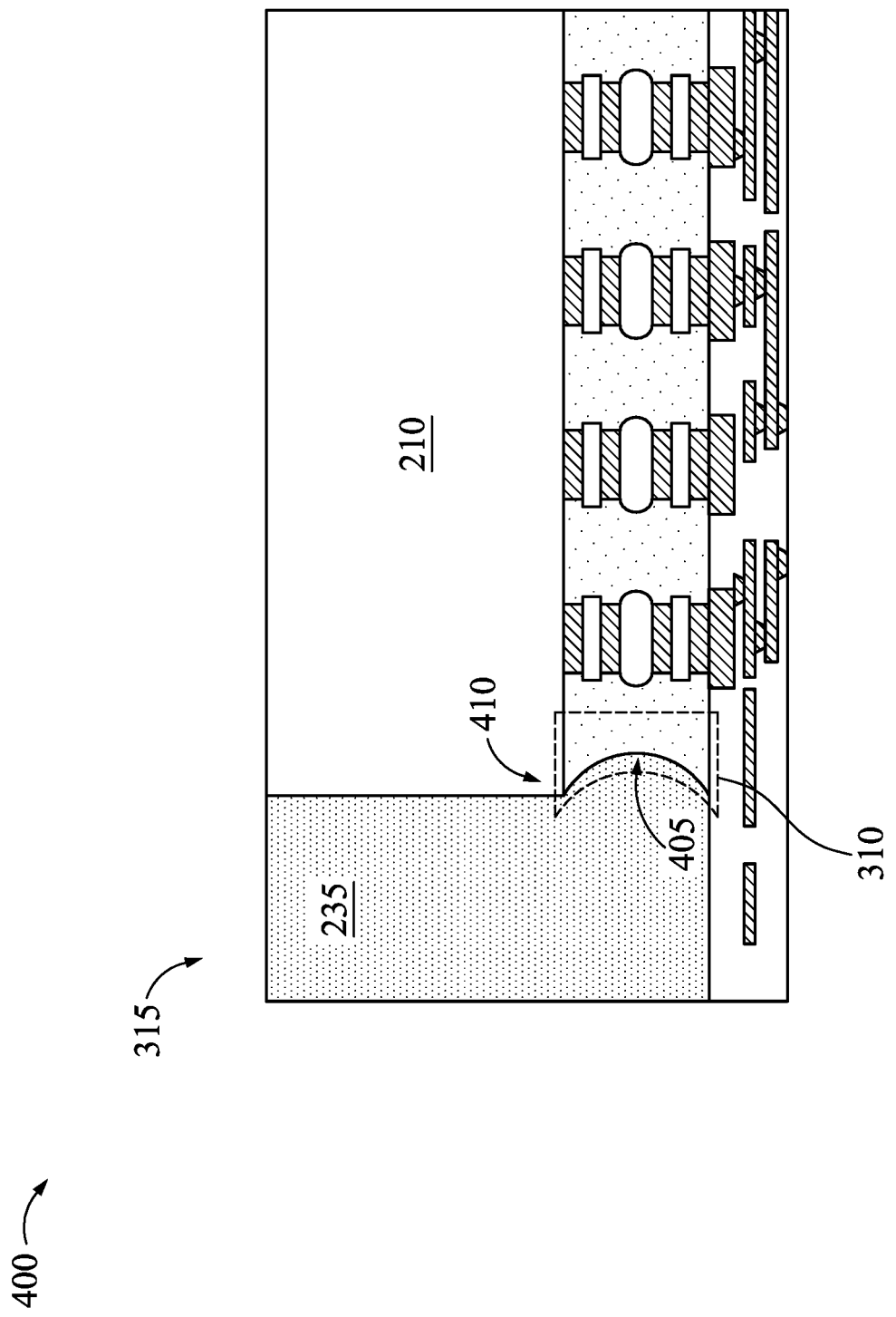
Figure 4B:
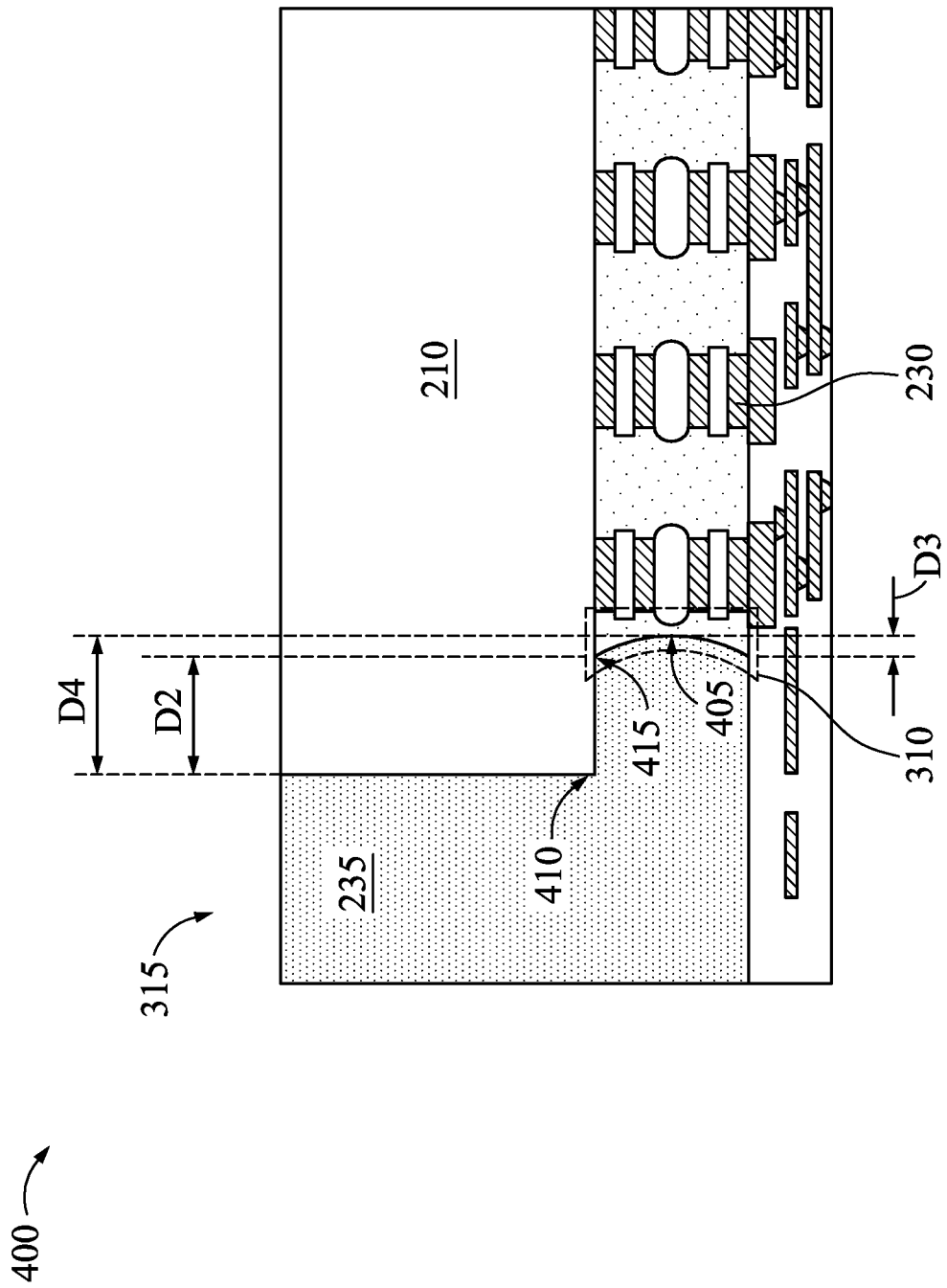
Figure 4C:
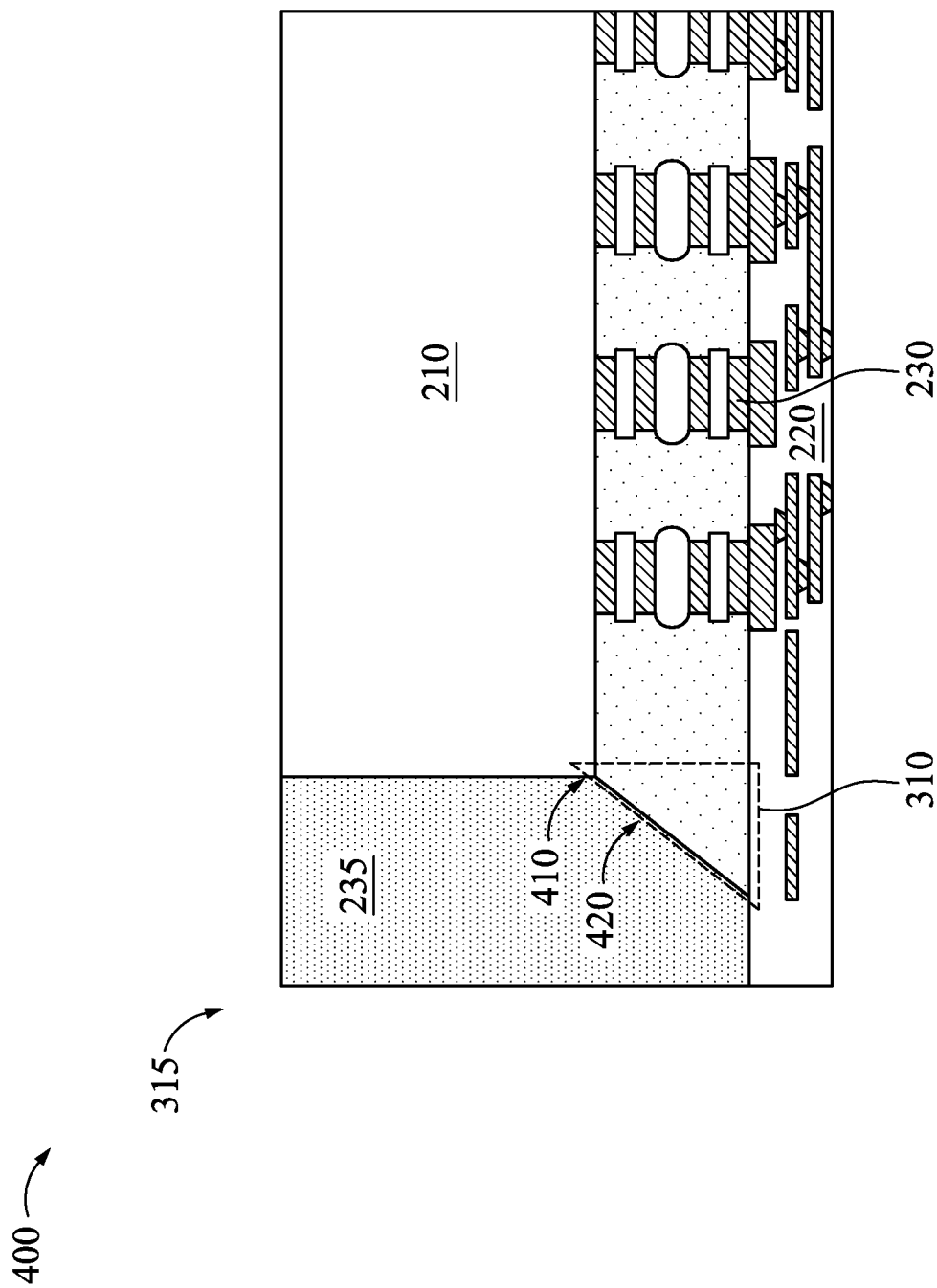

FIGS. 4A-4C are diagrams of one or more example implementations 400 described herein. The example implementations 400 include one or more example configurations of the semiconductor package 205 including the shaped fillet 310. Furthermore, FIGS. 4A-4C represent side views of the edge region 315 of the semiconductor package 205.

FIG. 4A shows an example of the shaped fillet 310 including a concave surface 405. As such, the shaped fillet 310 of FIG. 4A may include a concave shape (e.g., and correspond to a concave-shaped fillet). The concave surface 405 includes a curvature that intersects a bottom cornered edge 410 of the SoC IC die 210. In some implementations, the shaped fillet 310 of FIG. 4A absorbs strains across the entire bottom surface of the SoC IC die 210.

FIG. 4B shows another example of the shaped fillet 310 including the concave surface 405. Furthermore, the shaped fillet 310 of FIG. 4B may include a concave shape (e.g., and correspond to a concave-shaped fillet). In contrast to the example of FIG. 4A, the concave surface of 405 of FIG. 4B includes a curvature that intersects a portion 415 of the bottom surface of the SoC IC die 210 at a distance D2 from the bottom cornered edge 410 of the SoC IC die 210. In some implementations, the shaped fillet 310 of FIG. 4B may reduce an amount of underfill material (e.g., the pattern of underfill material 305) used in the semiconductor package 205 relative to the shaped fillet 310 of FIG. 4A. In some implementations, the distance D2 is included in a range of up to approximately 200 μm from the bottom cornered edge 410 (e.g., if the distance is approximately 0 μm, the shaped fillet 310 may correspond to the shaped fillet 310 of FIG. 4A). However, other values and ranges for the distance D2 are within the scope of the present disclosure.

Additional dimensional relationships may exist. For example, a depth D3 of an apex of the concave surface 405 from an intersection point of the shaped fillet 310 with the bottom surface of the SoC IC die 210 may be included in a range of up to approximately 200 μm from the intersection point. Additionally, or alternatively, a distance D4 of the apex of the concave surface 405 from a cornered edge (e.g., the bottom cornered edge 410) of the SoC IC die 210 may be included in a range of approximately up to 200 μm from the cornered edge of the SoC IC die 210. However, other values and ranges for the depth D3 and the distance D4 are within the scope of the present disclosure.

The distance D2, the depth D3, and the distance D4 may be a biproduct of several factors, including a viscosity of the underfill material (e.g., the underfill material used in the pattern of the underfill material 305) and/or a hydrophilic property of the underfill material. In some implementations, the distance D2, the depth D3, and the distance D4 may result from an angle of a nozzle (e.g., an angle relative to the interposer 220) of a dispense tool (e.g., the dispense tool of the encapsulation tool set 135) that dispenses the underfill material. Additionally, or alternatively, the distance D1 (e.g., the distance between the bottom surface of the SoC IC die 210 and the top surface of the interposer 220) and/or a quantity of the connection structures 230 may impact the distance D2, the depth D3, and/or the distance D4.

FIG. 4C shows another example of the shaped fillet 310. In FIG. 4C, the shaped fillet 310 includes an angled surface 420 that extends from the bottom cornered edge of the SoC IC die 210 towards an outer edge of the interposer 220. As such, the shaped fillet 310 of FIG. 4C may include a triangular shape (e.g., and correspond to a triangle-shaped fillet). In some implementations, the angled surface 420 distributes stresses and/or strains along horizontal and vertical vectors of the semiconductor package 205 to reduce a likelihood of damage (e.g., cracking) to the mold compound 235.

As indicated above, FIGS. 4A-4C are provided as examples. Other examples may differ from what is described with regard to FIGS. 4A-4C.

FIGS. 5A-5E are diagrams of one or more example implementations 500 described herein. The example implementations 500 include variations of the pattern of the underfill material 305, where the variations include one or more segments of shaped fillets (e.g., one or more segments of the shaped fillet 310). Furthermore, FIGS. 5A-5E represent top views of the semiconductor package 205.

A structure of the example implementations 500 of FIGS. 5A-5E includes the interposer 220, the SoC IC die 210a (a first IC die), and the SoC IC die 210b (a second IC die). The SoC IC die 210a and the SoC IC die 210b are adjacent to one another and have edges that form an approximately rectangular perimeter 505. In some implementations, top surfaces of the segments of the shaped fillet 310 are below planes corresponding to bottom surfaces of the SoC IC die 210a and the SoC IC die 210b.

Figure 5A:
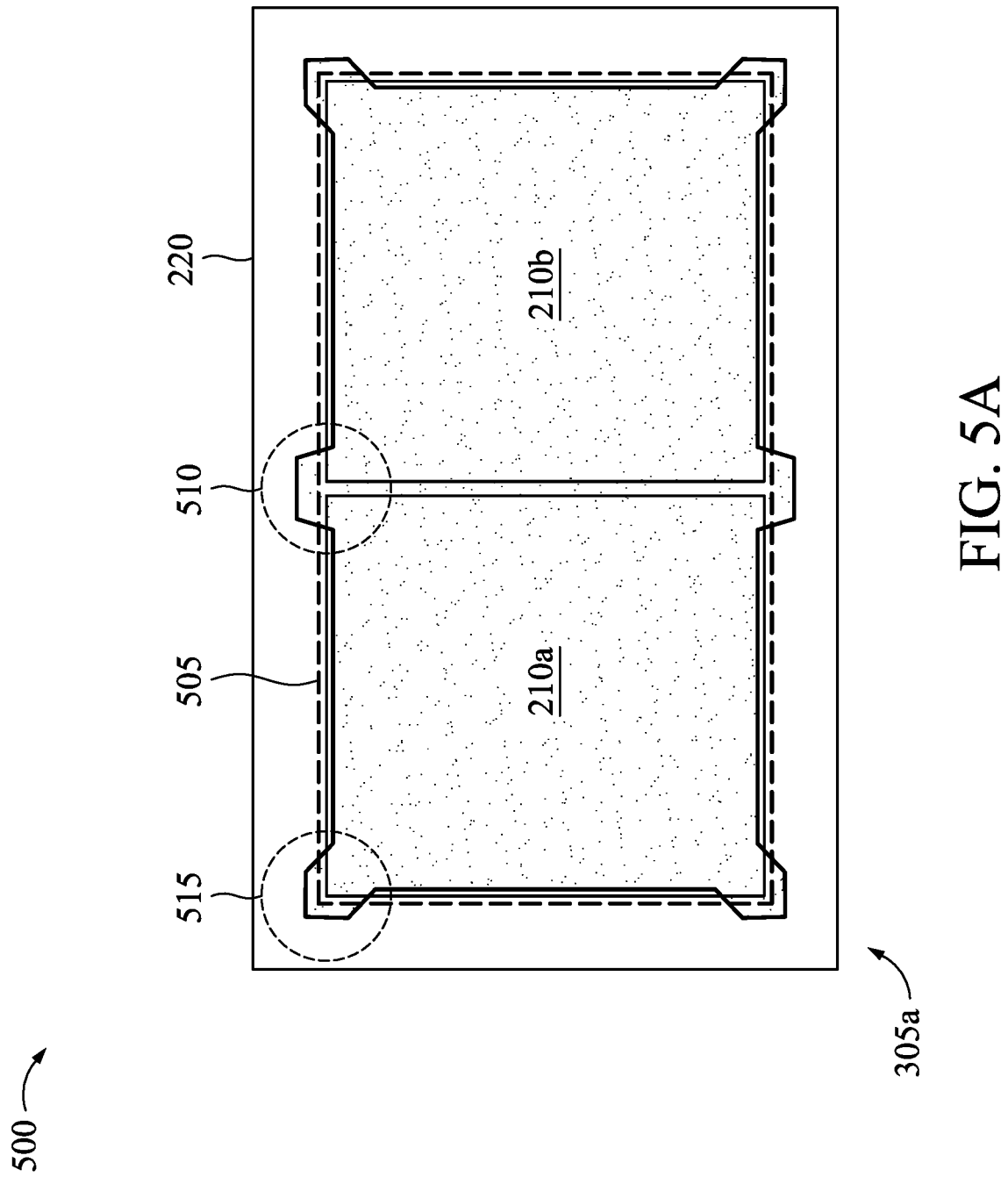

FIG. 5A shows an example pattern of underfill material (e.g., the pattern of underfill material 305a) including segments of the shaped fillets. The segments of the shaped fillets include portions that protrude beyond the approximately rectangular perimeter 505. The segments of shaped fillets further include other portions that are retracted within the approximately rectangular perimeter 505. The portions that protrude beyond the approximately rectangular perimeter 505 include midsegments 510 along midregions of first opposing sides of the approximately rectangular perimeter 505 that are located adjacent to opposing ends of adjacent, mutually-facing regions of the SoC IC die 210a (e.g., the first IC die) and the SoC IC die 210b (e.g., the second IC die). The portions that protrude beyond the approximately rectangular perimeter 505 further include corner segments 515 along corner regions of the approximately rectangular perimeter 505. As part of the pattern of underfill material 305a, the portions that protrude beyond the approximately rectangular perimeter 505 exclude other segments along the approximately rectangular perimeter 505 between the corner segments 515 and the midsegments 510. The portions that protrude beyond the approximately rectangular perimeter 505 further exclude other segments along the approximately rectangular perimeter 505 between the corner segments 515 and along second opposing sides of the approximately rectangular perimeter 505. In other words, the pattern of underfill material 305a consists essentially of the midsegments 510 and the corner segments 515 in some embodiments. The segments of the shaped fillets include top surfaces that are located at or below planes corresponding to bottom surfaces of the SoC IC die 210a (e.g., the first IC die) and the SoC IC die 210b (e.g., the second IC die). Additionally, or alternatively, the segments of the shaped fillets exclude top surfaces that are located above planes corresponding to bottom surfaces of the SoC IC die 210a and the SoC IC die 210b.

Figure 5B:
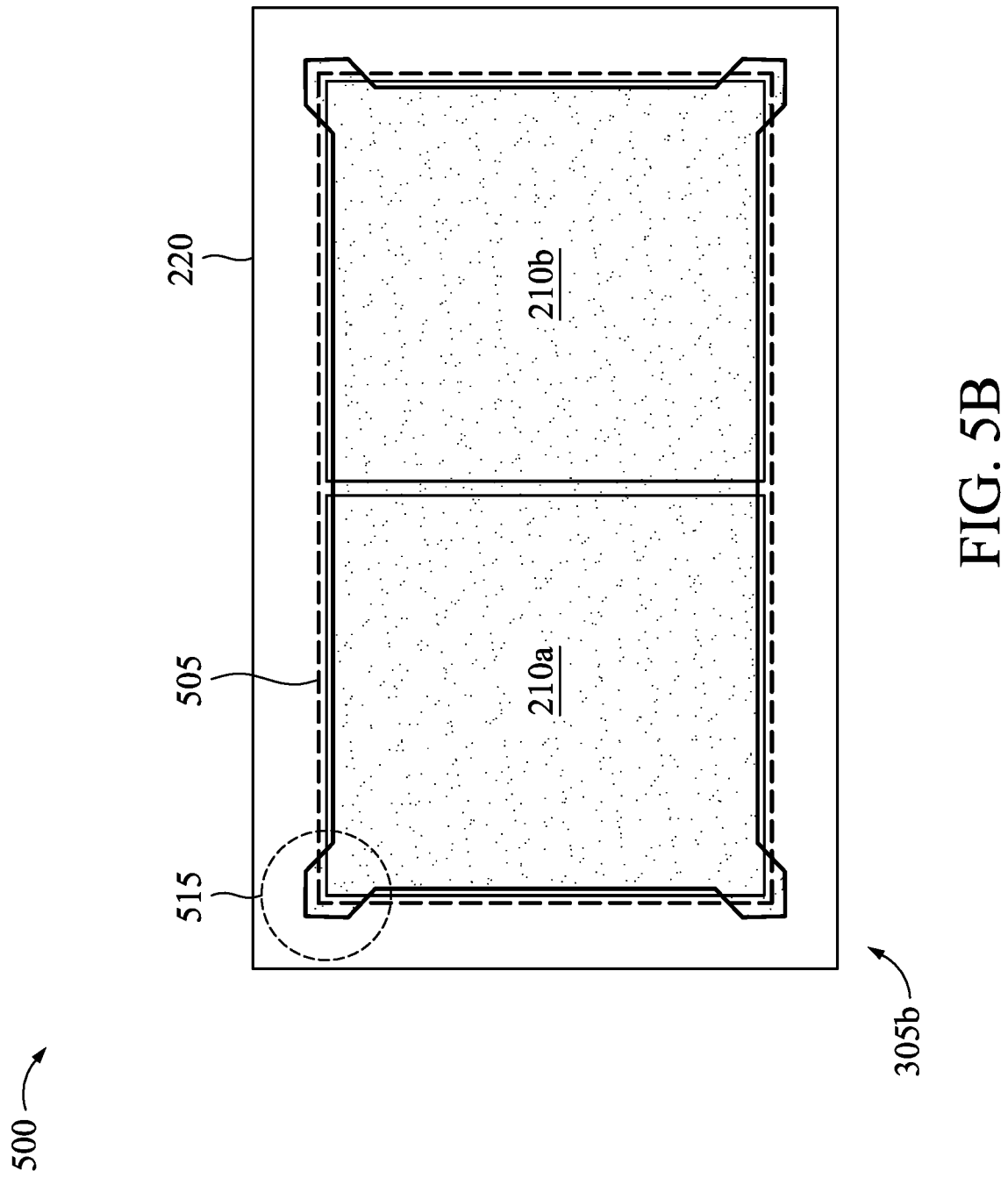

FIG. 5B shows another example pattern of underfill material (e.g., the pattern of underfill material 305b) including segments of the shaped fillets. The segments of the shaped fillets include portions that protrude beyond the approximately rectangular perimeter 505. The portions that protrude beyond the approximately rectangular perimeter 505 include the corner segments 515 along corner regions of the approximately rectangular perimeter 505. As part of the pattern of underfill material 305b, the portions that protrude beyond the approximately rectangular perimeter 505 exclude other segments along the approximately rectangular perimeter 505 between the corner segments 515. In other words, the pattern of underfill material 305b consists essentially of the corner segments 515 in some embodiments. The segments of the shaped fillets include top surfaces that are located at or below planes corresponding to bottom surfaces of the SoC IC die 210a (e.g., the first IC die) and the SoC IC die 210b (e.g., the second IC die). Additionally, or alternatively, the segments of the shaped fillets exclude top surfaces that are located above planes corresponding to bottom surfaces of the SoC IC die 210a and the SoC IC die 210b.

Figure 5C:
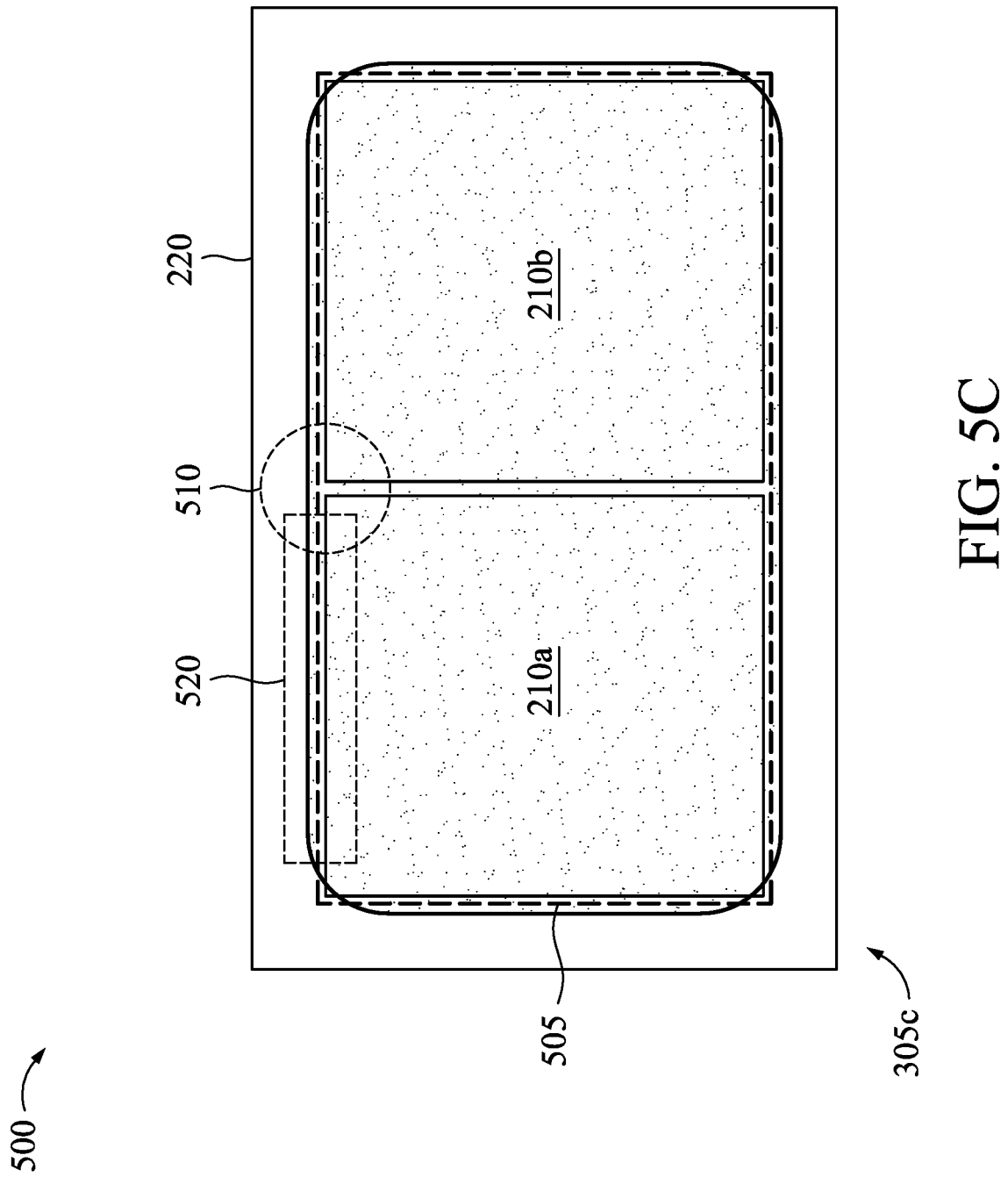

FIG. 5C shows another example pattern of underfill material (e.g., the pattern of underfill material 305c) including segments of the shaped fillets. The segments of the shaped fillets include portions that protrude beyond the approximately rectangular perimeter 505. The segments of shaped fillets further include other portions that are retracted within the approximately rectangular perimeter 505. The portions that protrude beyond the approximately rectangular perimeter 505 include linear segments 520 along outer facing regions of the SoC IC die 210a and the SoC IC die 210b. The portions that protrude beyond the approximately rectangular perimeter 505 further include the midsegments 510 along midregions of first opposing sides of the approximately rectangular perimeter 505 that are located adjacent to opposing ends of adjacent, mutually-facing regions of the SoC IC die 210a and the SoC IC die 210b. As part of the pattern of underfill material 305c, the portions that protrude beyond the approximately rectangular perimeter 505 exclude other segments along corner regions of the approximately rectangular perimeter 505. In other words, the pattern of underfill material 305c consists essentially of the linear segments 520 and the midsegments 510 in some embodiments. The segments of the shaped fillets include top surfaces that are located at or below planes corresponding to bottom surfaces of the SoC IC die 210a (e.g., the first IC die) and the SoC IC die 210b (e.g., the second IC die). Additionally, or alternatively, the segments of the shaped fillets exclude top surfaces that are located above planes corresponding to bottom surfaces of the SoC IC die 210a and the SoC IC die 210b.

Figure 5D:
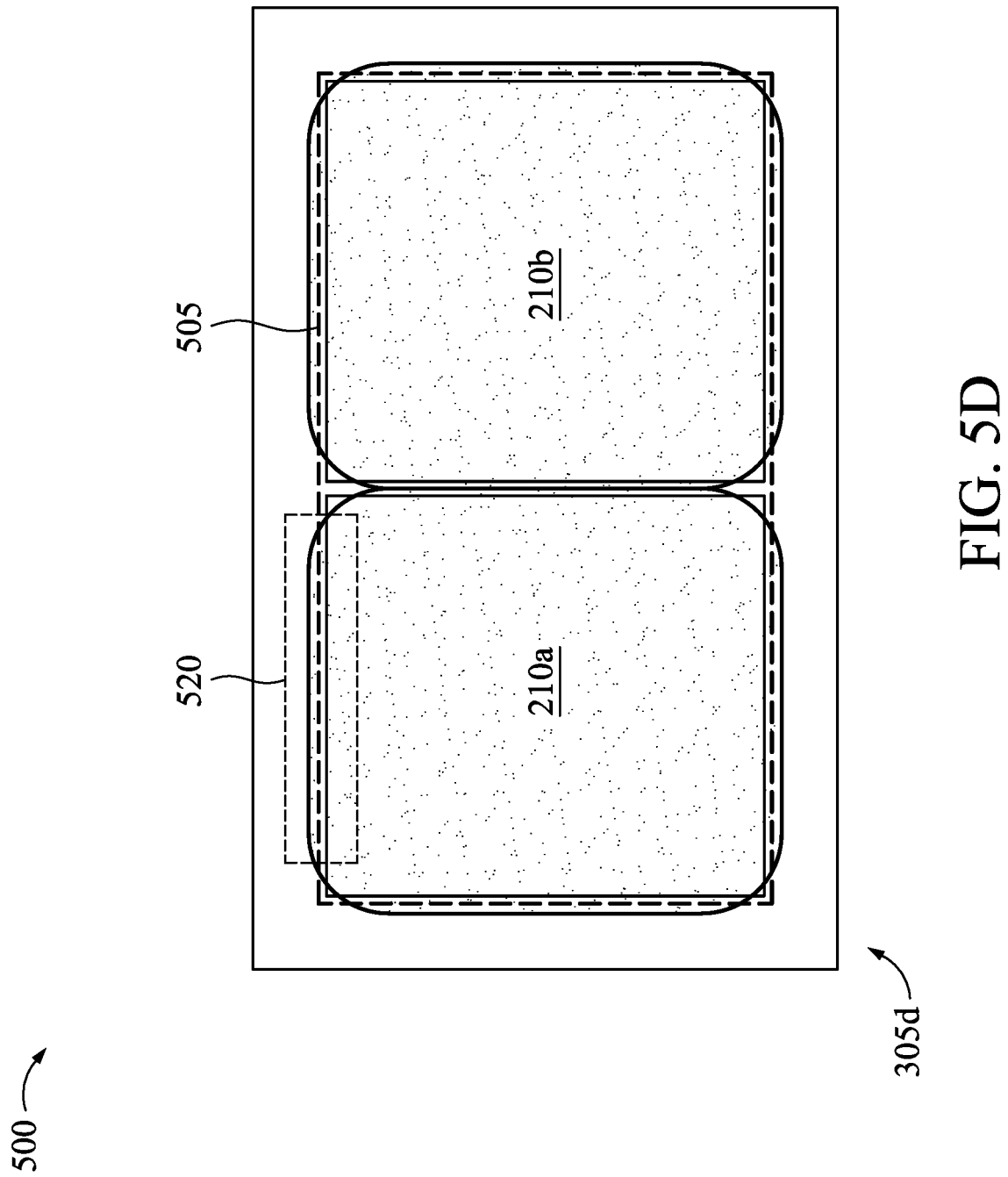

FIG. 5D shows another example pattern of underfill material (e.g., the pattern of underfill material 305d) including segments of the shaped fillets. The segments of the shaped fillets include portions that protrude beyond the approximately rectangular perimeter 505. The segments of shaped fillets further include other portions that are retracted within the approximately rectangular perimeter 505. The portions that protrude beyond the approximately rectangular perimeter 505 include linear segments 520 along outer facing regions of the SoC IC die 210a and the SoC IC die 210b. As part of the pattern of underfill material 305d, the portions that protrude beyond the approximately rectangular perimeter 505 exclude other segments along corner regions of the approximately rectangular perimeter 505. The portions that protrude beyond the approximately rectangular perimeter 505 further exclude other segments along midregions of first opposing sides of the approximately rectangular perimeter 505 that are located adjacent to opposing ends of adjacent, mutually-facing regions of the SoC IC die 210a and the SoC IC die 210b. In other words, the pattern of underfill material 305d consists essentially of the linear segments 520 in some embodiments. The segments of the shaped fillets include top surfaces that are located at or below planes corresponding to bottom surfaces of the SoC IC die 210a (e.g., the first IC die) and the SoC IC die 210b (e.g., the second IC die). Additionally, or alternatively, the segments of the shaped fillets exclude top surfaces that are located above planes corresponding to bottom surfaces of the SoC IC die 210a and the SoC IC die 210b.

Figure 5E:
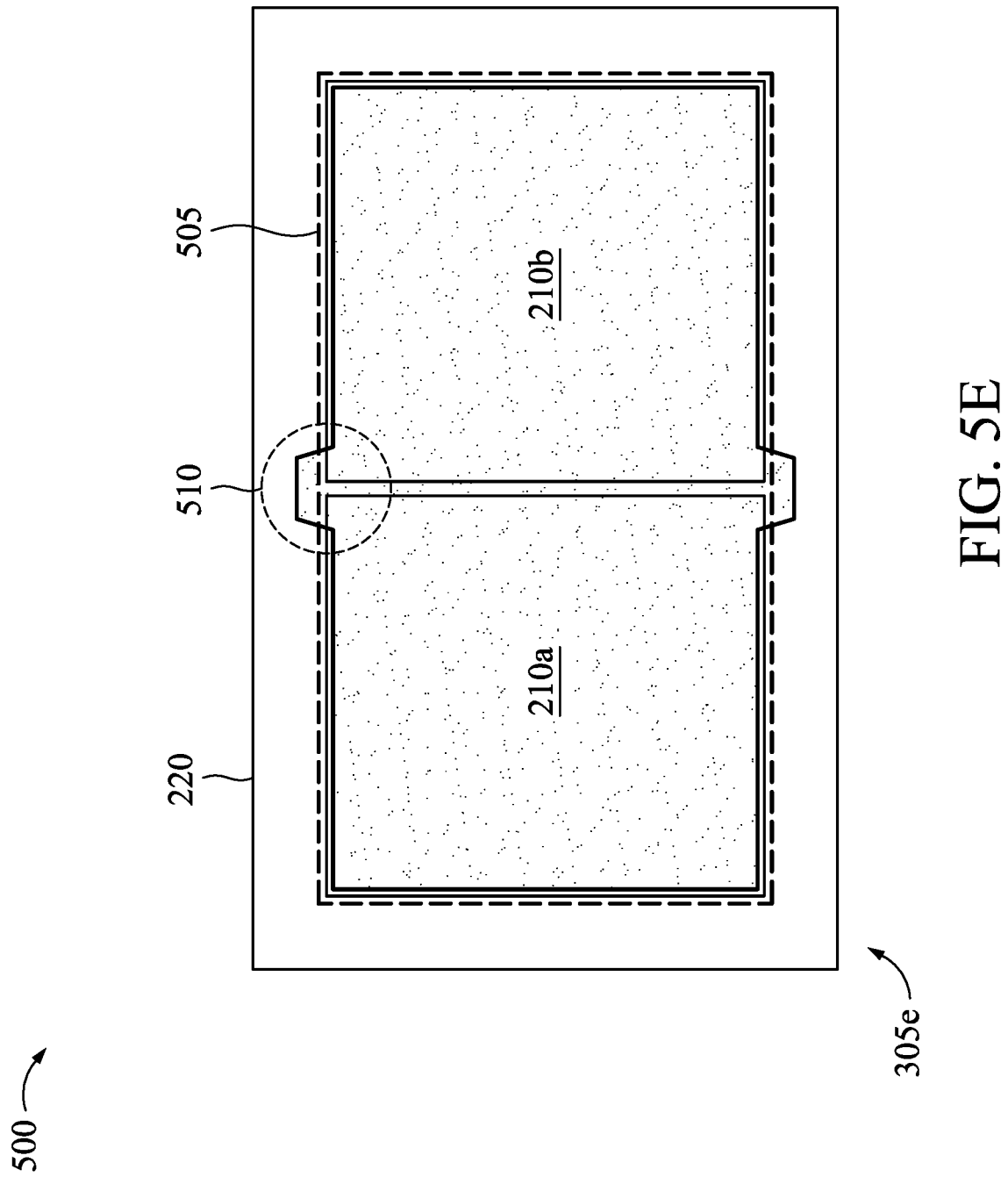

FIG. 5E shows another example pattern of underfill material (e.g., the pattern of underfill material 305e) including segments of the shaped fillets. The segments of the shaped fillets include portions that protrude beyond the approximately rectangular perimeter 505. The segments of shaped fillets further include other portions that are retracted within the approximately rectangular perimeter 505. The portions that protrude beyond the approximately rectangular perimeter 505 include the midsegments 510 along midregions of opposing sides of the approximately rectangular perimeter 505 that are located adjacent to opposing ends of adjacent, mutually-facing regions of the SoC IC die 210a and the SoC IC die 210b. As part of the pattern of underfill material 305e, the portions that protrude beyond the approximately rectangular perimeter 505 exclude other segments along outer facing regions of the SoC IC die 210a and the SoC IC die 210b. The portions that protrude beyond the approximately rectangular perimeter 505 further exclude other segments along corner regions of the approximately rectangular perimeter 505. In other words, the pattern of underfill material 305e consists essentially of the midsegments 510 in some embodiments. The segments of the shaped fillets include top surfaces that are located at or below planes corresponding to bottom surfaces of the SoC IC die 210a (e.g., the first IC die) and the SoC IC die 210b (e.g., the second IC die). Additionally, or alternatively, the segments of the shaped fillets exclude top surfaces that are located above planes corresponding to bottom surfaces of the SoC IC die 210a and the SoC IC die 210b.

Selection of one of the patterns of underfill material 305a-305e may be dependent on one or more factors. Examples of such factors include an individual IC die size (e.g., a footprint of the SoC IC die 210a and/or the SoC IC die 210b), an amount or pattern of connection structures (e.g., the connection structures 230) connecting an IC die to a substrate, and/or a property of an underfill material, among other examples.

In some implementations, the patterns of underfill material 305a-305e include segments having shaped fillets (e.g., the shaped fillet 310) of a same shape (e.g., the midsegment 510, the corner segment 515, and the linear segment 520 may each correspond to a concave-shape or a triangular shape, among other examples). In some implementations, the patterns of underfill material 305a-305e include segments having shaped fillets (e.g., the shaped fillet 310) of different shapes (e.g., the midsegment 510 and the corner segment 515 may correspond to a concave-shape, and the linear segment 520 may correspond to triangular-shape, among other examples).

As indicated above, FIGS. 5A-5E are provided as examples. Other examples may differ from what is described with regard to FIGS. 5A-5E.

FIGS. 6A-6L are diagrams of an example implementation 600 described herein. The example implementation 600 includes a series of operations that may be performed by one or more of the semiconductor processing tool sets 105-150 to form the semiconductor package 205 including the shaped fillet 310. In some implementations, the series of operations corresponds to a chip-on-wafer-on-substrate (CoWoS) packaging process.

Figure 6A:
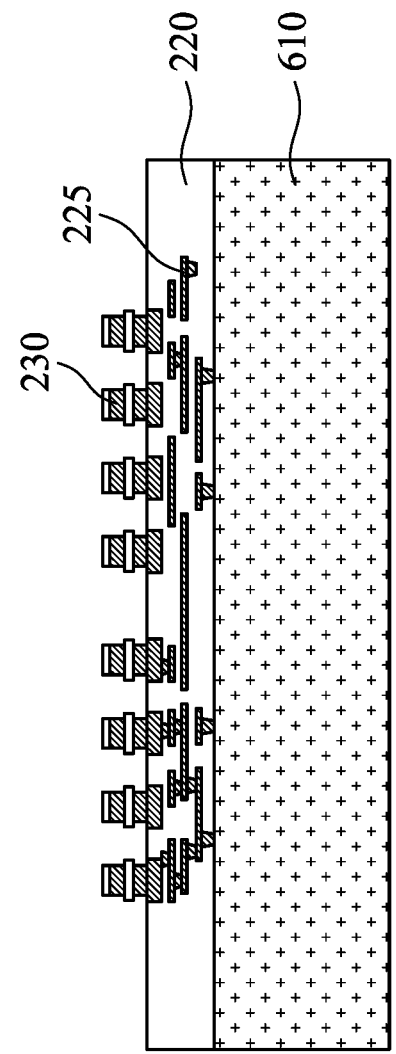

As shown in FIG. 6A, one or more tools of a semiconductor processing tool set (e.g., the spin coating tool and the plating tool of the RDL tool set 105, among other examples) may perform a series of operations 605 to form the interposer 220 including a portion of the connection structures 230. For example, the spin coating tool may deposit one or more layer of a polyimide material on a first temporary carrier 610 (e.g., a silicon wafer, among other examples) and the plating tool may deposit the electrically-conductive traces 225 (e.g., RDL traces) and a portion of the connection structures 230.

Figure 6B:
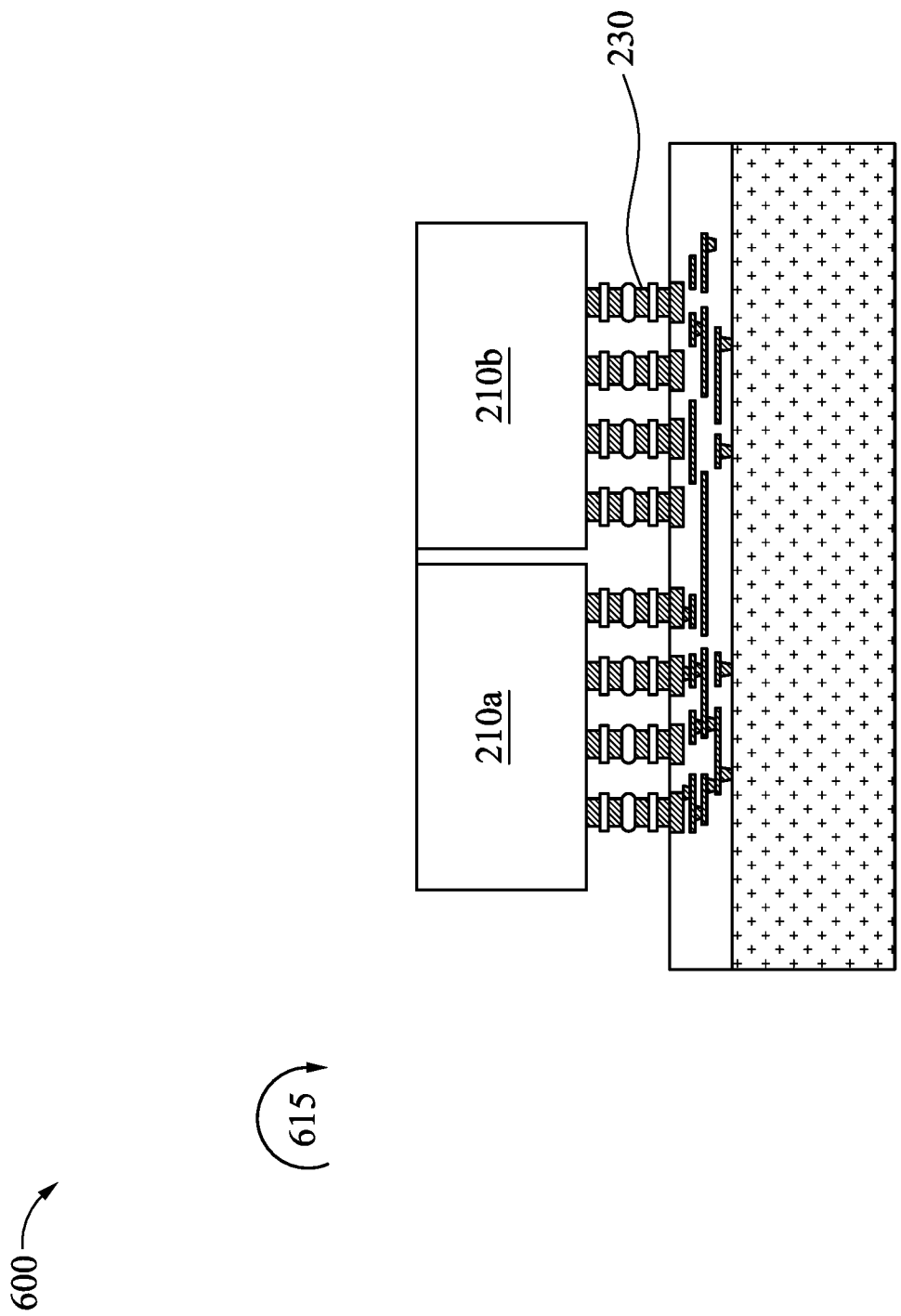

As shown in FIG. 6B, one or more tools of semiconductor processing tool sets (e.g., the plating tool of the connection tool set 115 and pick-and-place/reflow tools of the die-attach tool set 130, among other examples) may perform a series of operations 615 to attach the SoC IC die 210a and the SoC IC die 210b to the interposer 220. For example, the plating tool may form other portions of the connection structures 230 on the SoC IC die 210a and on the SoC IC die 210b. Additionally, or alternatively, the pick-and-place tool and/or the reflow tool of the die-attach tool set 130 may attach the SoC IC die 210a and the SoC IC die 210b to the interposer 220 using the connection structures 230.

Figure 6C:
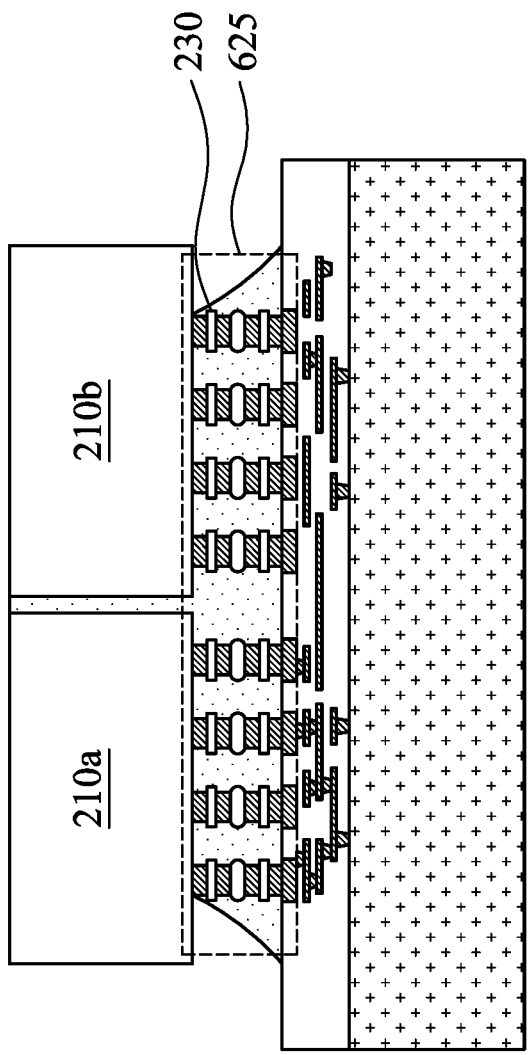

As shown in FIG. 6C, one or more tools of a semiconductor processing tool set (e.g., the dispense tool of the encapsulation tool set 135, among other examples) may perform a series of operations 620 to form a first portion 625 of the underfill pattern (e.g., the pattern of underfill material 305) around the connection structures 230. To form the first portion 625, the dispense tool may dispense a first underfill material between the interposer and the IC dies (e.g., the SoC IC die 210a and the SoC IC die 210b).

Figure 6D:
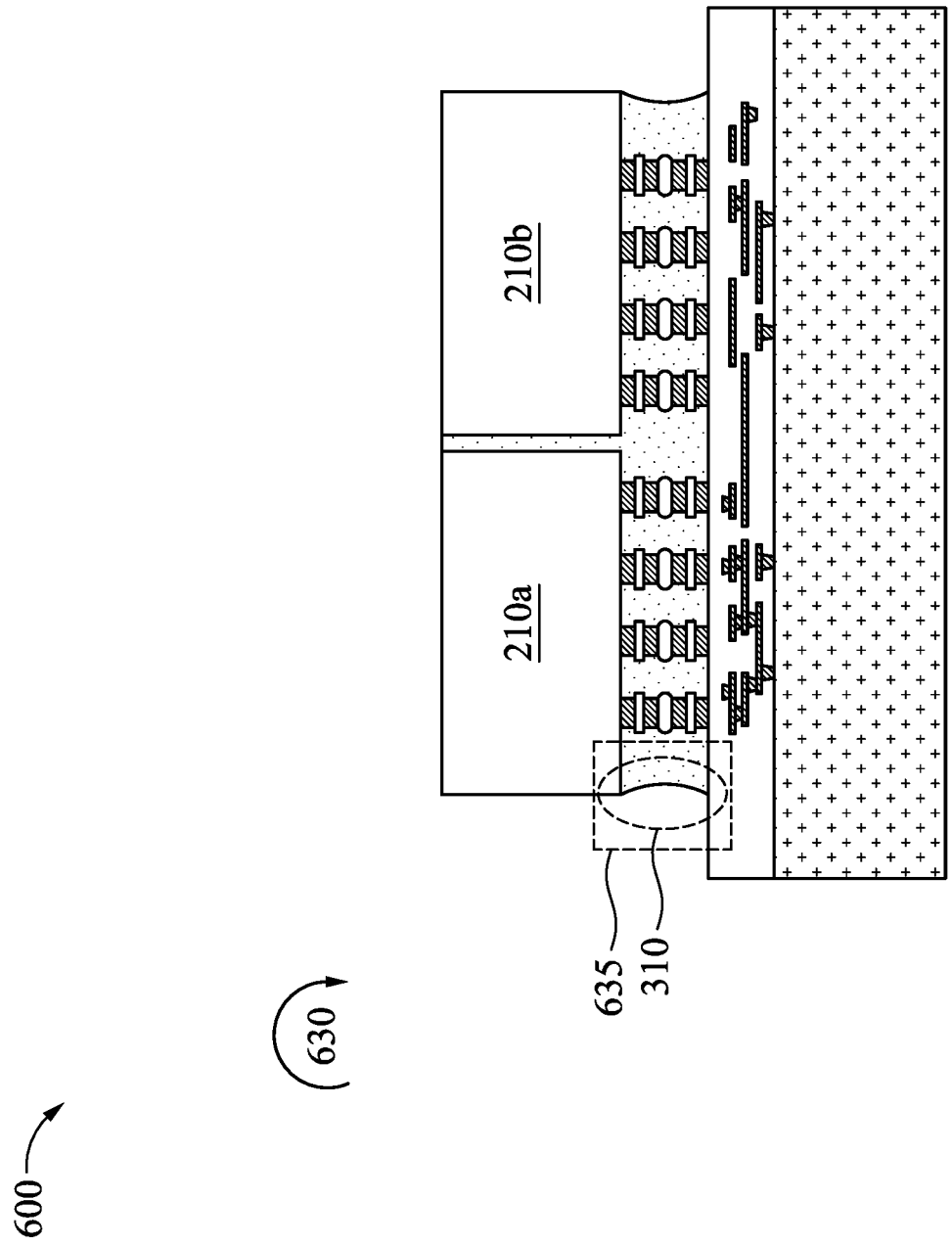

As shown in FIG. 6D, one or more tools of a semiconductor processing tool set (e.g., the dispense tool of the encapsulation tool set 135, among other examples) may perform a series of operations 620 to form a second portion 635 of the underfill pattern (e.g., the pattern of underfill material 305) completely below the SoC IC die 210a and the SoC IC die 210b. To form the second portion 635, the dispense tool may dispense a second underfill material between the interposer and the IC dies (e.g., the SoC IC die 210a and the SoC IC die 210b) near edges of the IC dies. In some implementations, the second underfill material deposited as part of the series of operations 630 is a same underfill material as the first underfill material deposited as part of the series of operations 620. In some implementations, the second underfill material deposited as part of the series of operations 630 is a different underfill material than the first underfill material deposited as part of the series of operations 620.

Figure 6E:
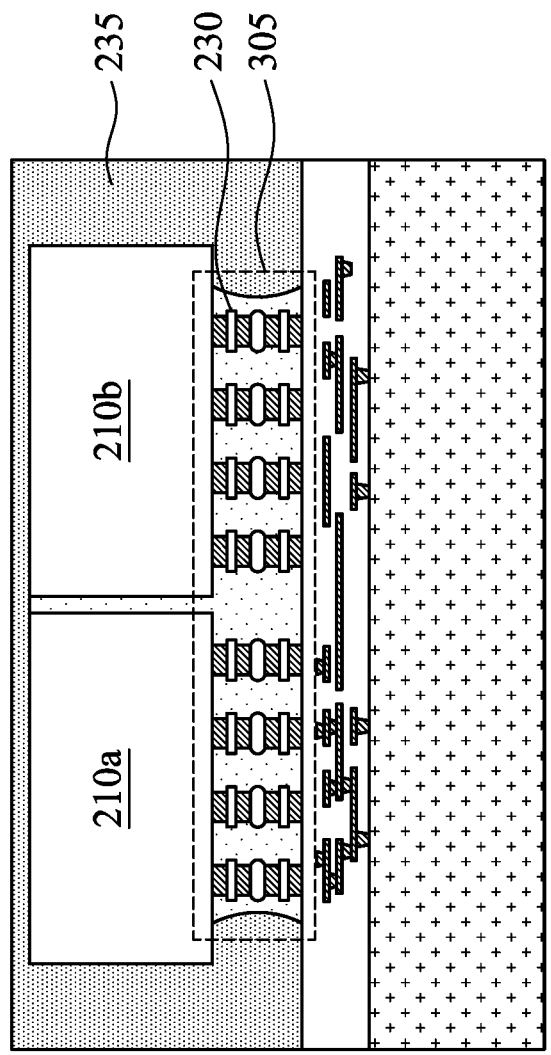

As shown in FIG. 6E, one or more tools of a semiconductor processing tool set (e.g., the mold tool of the encapsulation tool set 135, among other examples) may perform a series of operations 640 to encapsulate the SoC IC die 210*a*, the SoC IC die 210*b*, the connection structures 230, and the pattern of underfill material 305 within the mold compound 235. In some implementations, and as part of the series of operations 640, another semiconductor processing tool (e.g., the grinding tool of the CMP of the planarization tool set 110, among other examples) may planarize the mold compound 235.

Figure 6F:
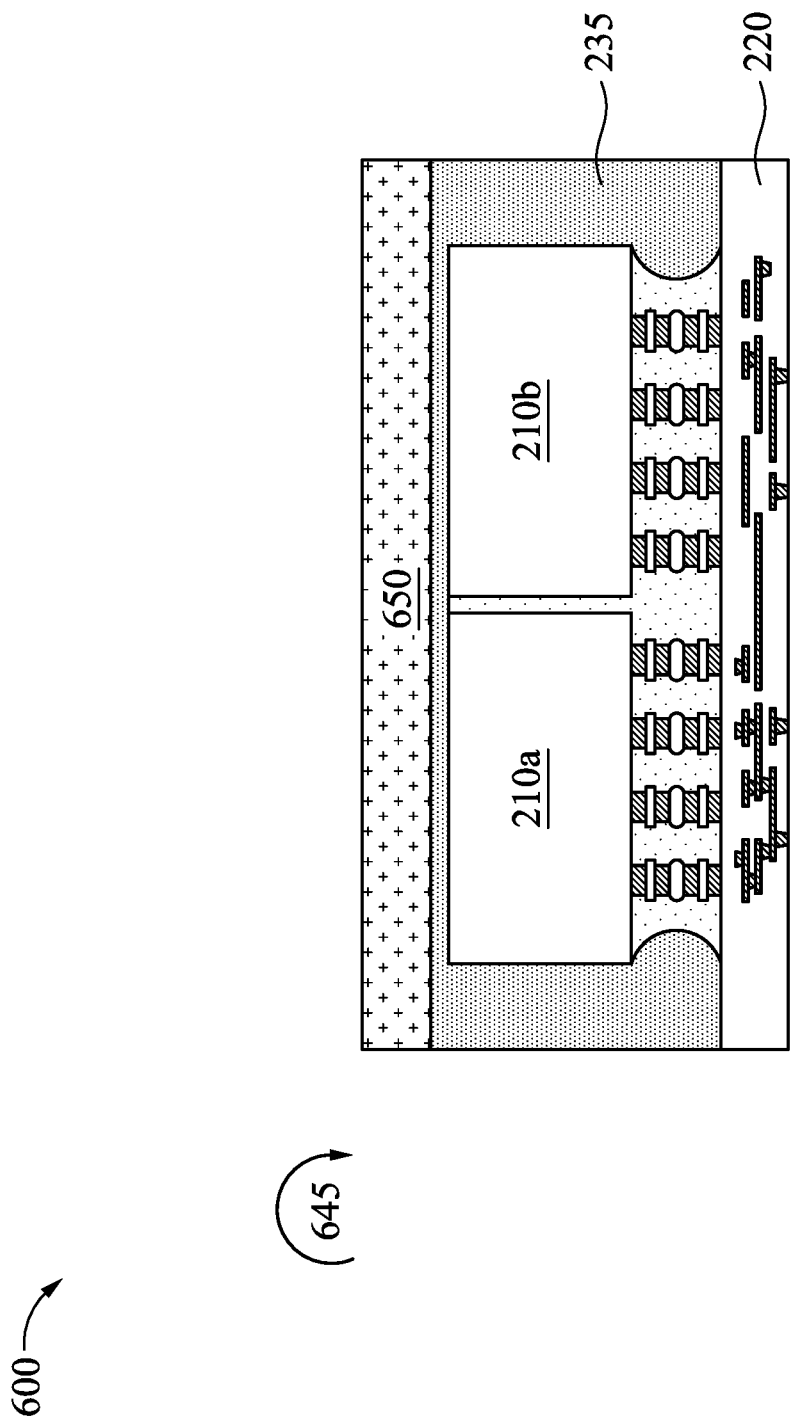

As shown in FIG. 6F, one or more tools of a semiconductor processing tool set (e.g., the bonding tool and the debonding tool of the RDL tool set 105, among other examples) may perform a series of operations 645 to attach (e.g., bond) a second temporary carrier 650 (e.g., a silicon wafer, among other examples) to a surface of the mold compound 235. The set of operations 645 may include removing (e.g., debonding) the first temporary carrier 610 from the interposer 220.

Figure 6G:
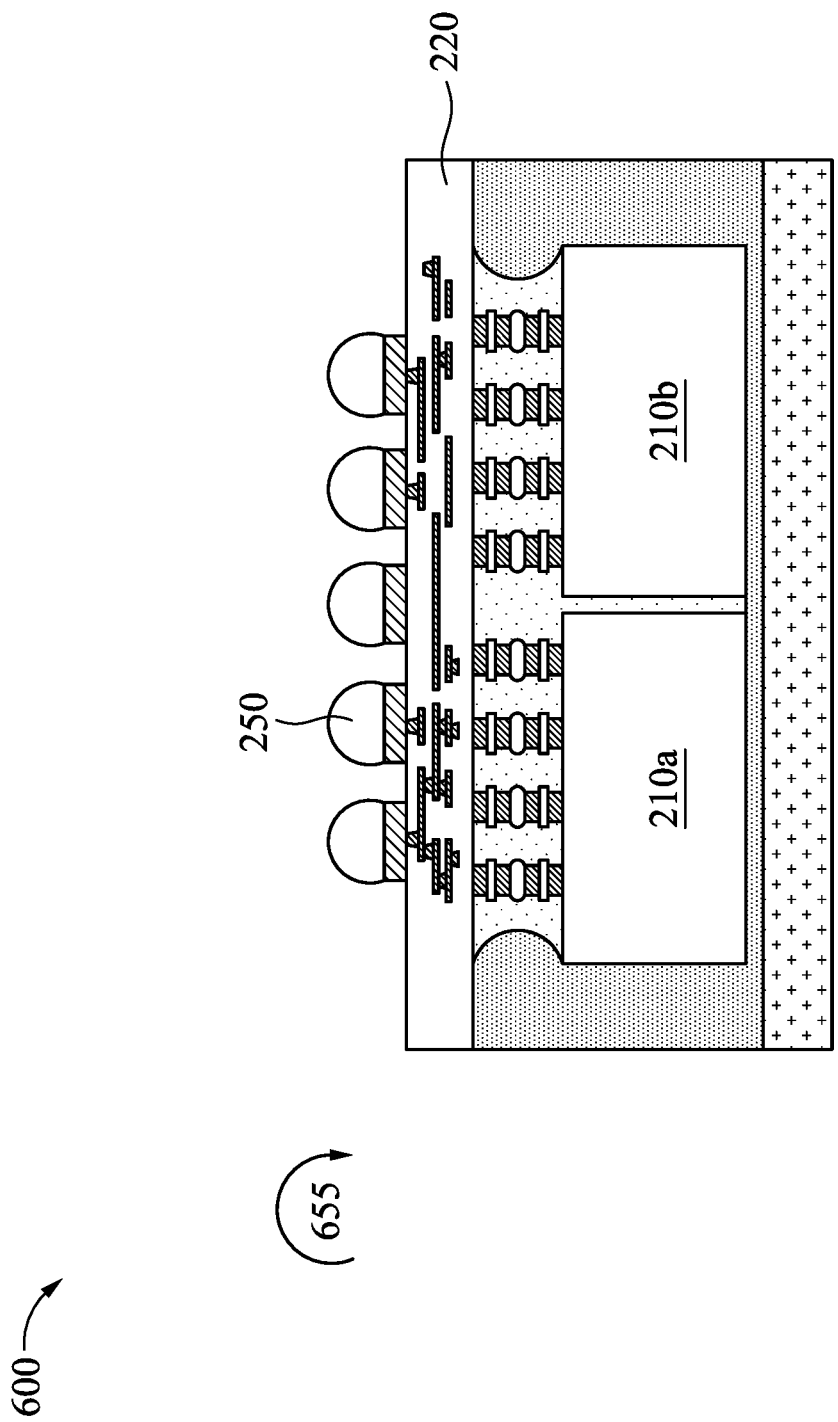

As shown in FIG. 6G, one or more tools of a semiconductor processing tool set (e.g., the bumping tool of the connection tool set 115, among other examples) may perform a series of operations 655 to form the connection structures 250 on the interposer 220.

Figure 6H:
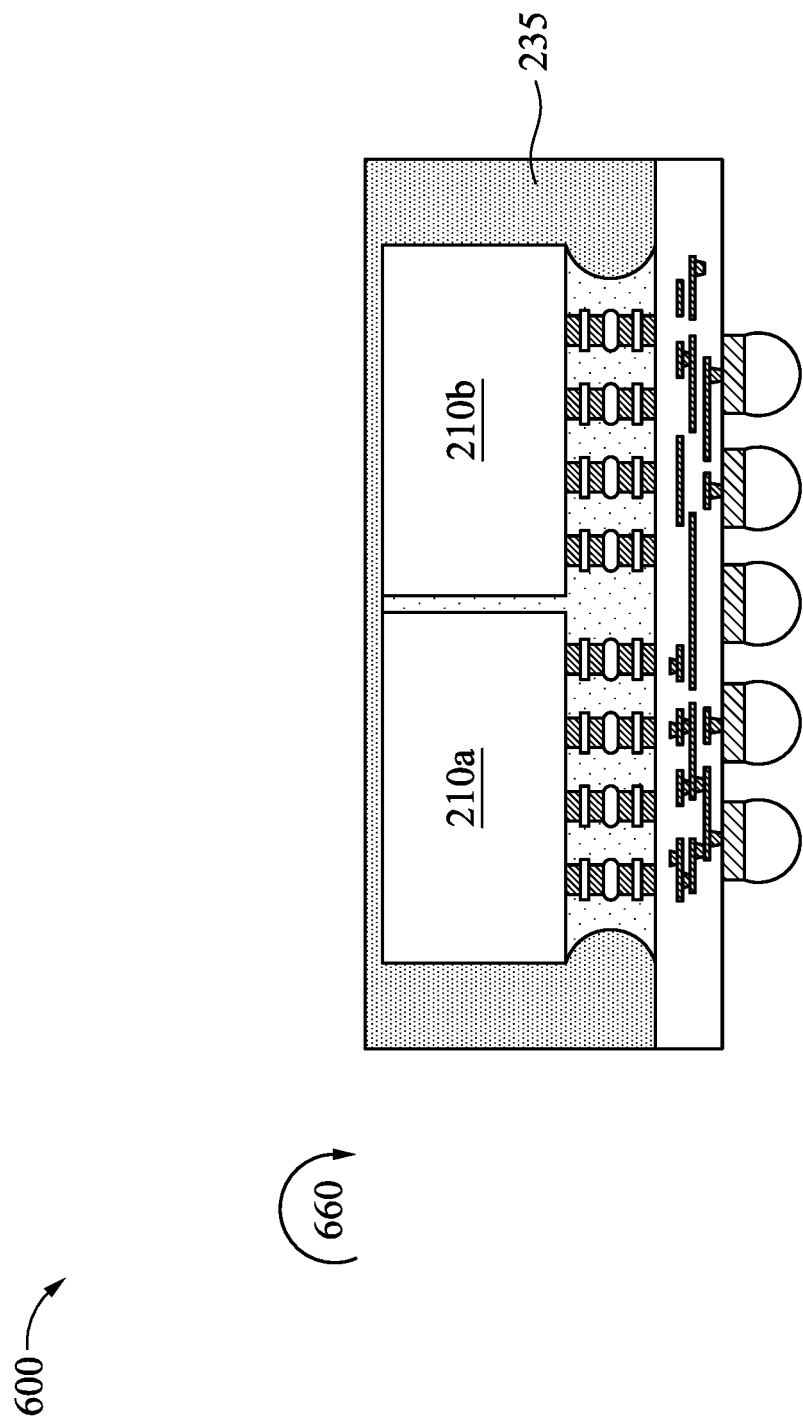

As shown in FIG. 6H, one or more tools of a semiconductor processing tool set (e.g., the debonding tool of the RDL tool set 105, among other examples) may perform a series of operations 660 to remove the second temporary carrier 650 from the surface of the mold compound 235.

Figure 6I:
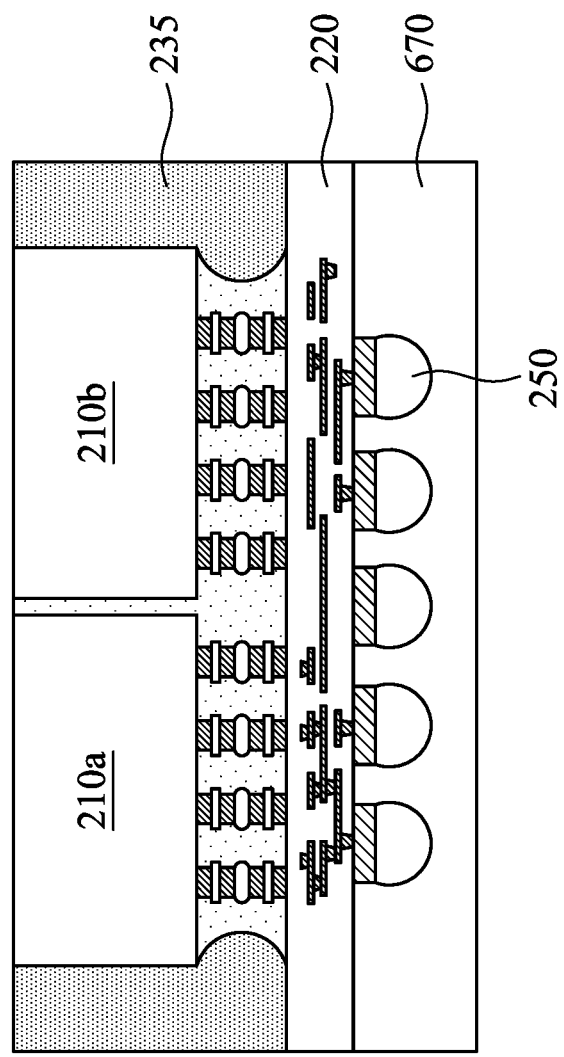

A shown in FIG. 6I, one or more tools of a semiconductor processing tool set (e.g., the taping tool and the CMP tool of the planarization tool set 110, among other examples) may perform a series of operations 665. The series of operations 665 may include the taping tool applying a backgrind tape 670 to the connection structures 250 and/or the interposer 220. The series of operations 665 may further include the CMP tool removing portions of the mold compound 235 to exposes surfaces of the SoC IC die 210*a* and the SoC IC die 210*b*.

Figure 6J:
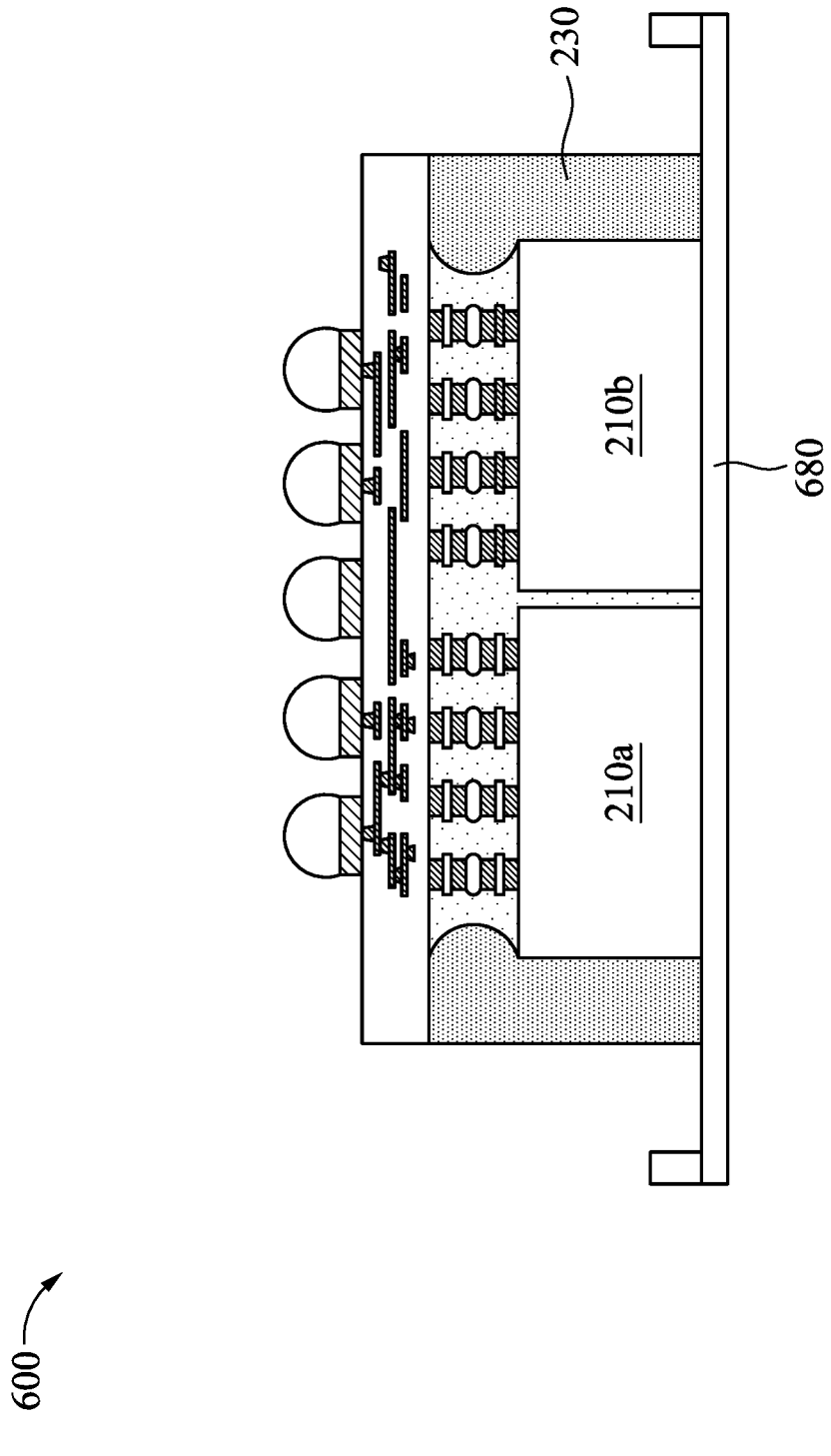

As shown in FIG. 6J, one or more tools of one or more semiconductor processing tool sets (e.g., the pick-and-place tool of the die-attach tool set 130 and the sawing tool of the singulation tool set 125, among other examples) may perform a series of operations 675. The series of operations 675 may include, for example, the pick-and-place tool attaching surfaces of the SoC IC die 210*a*, the SoC IC die 210*b*, and the mold compound 235 to a film frame carrier 680. In some implementations, the series of operations 675 includes the sawing tool sawing the interposer 220 and/or the mold compound 235 to separate a structure including the SoC IC die 210*a*, the SoC IC die 210*b*, the interposer 220, and the mold compound 235 from a similar, adjacent structure.

Figure 6K:
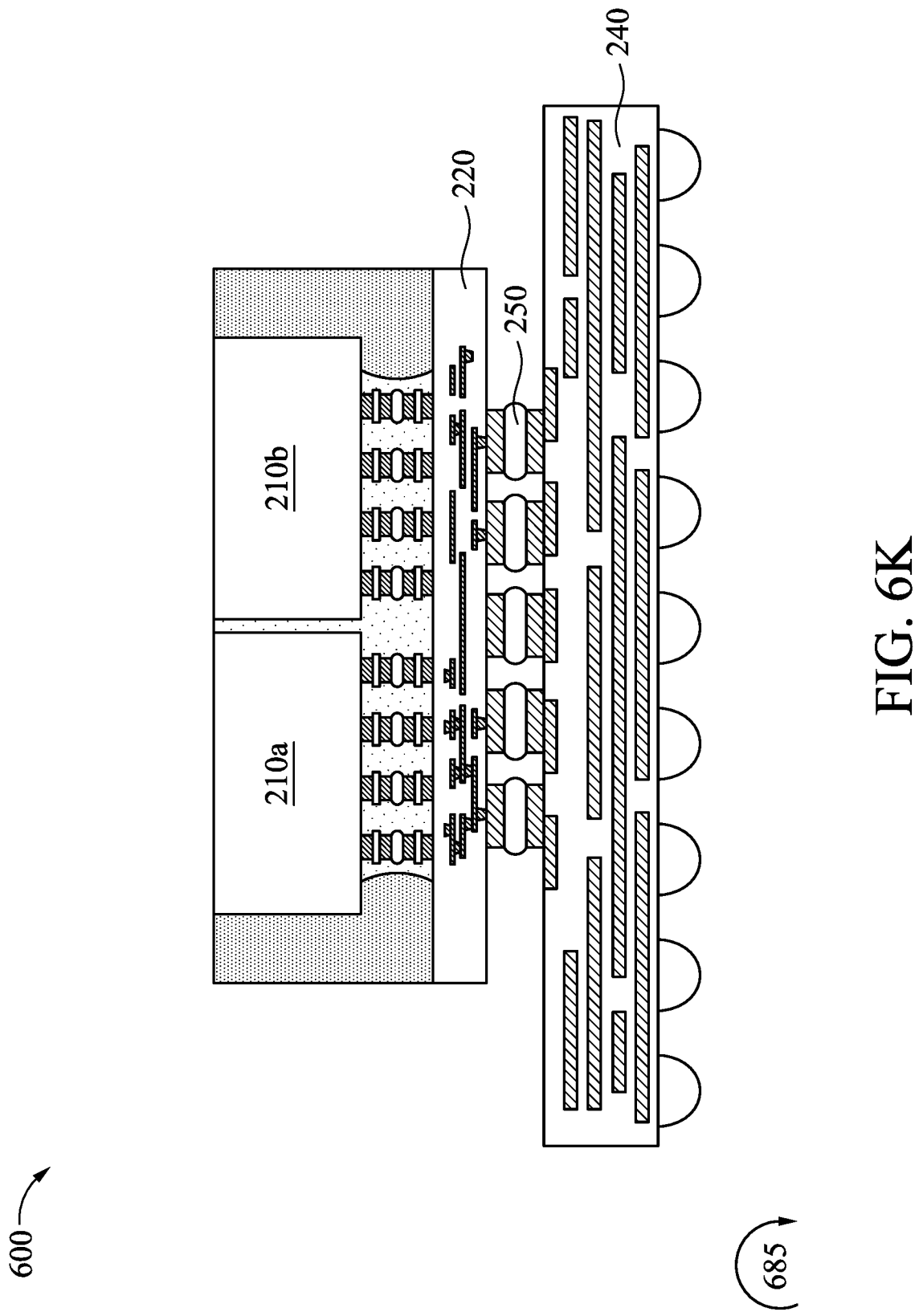

As shown in FIG. 6K, one or more tools of a semiconductor processing tool set (e.g., the pick-and-place tool and the reflow tool of the die-attach tool set the die-attach tool set 130, among other examples) may perform a series of operations 685. The series of operations 685 may include, for example, the pick-and-place tool and the reflow tool attaching the interposer 220 to the substrate 240 using the connection structures 250.

Figure 6L:
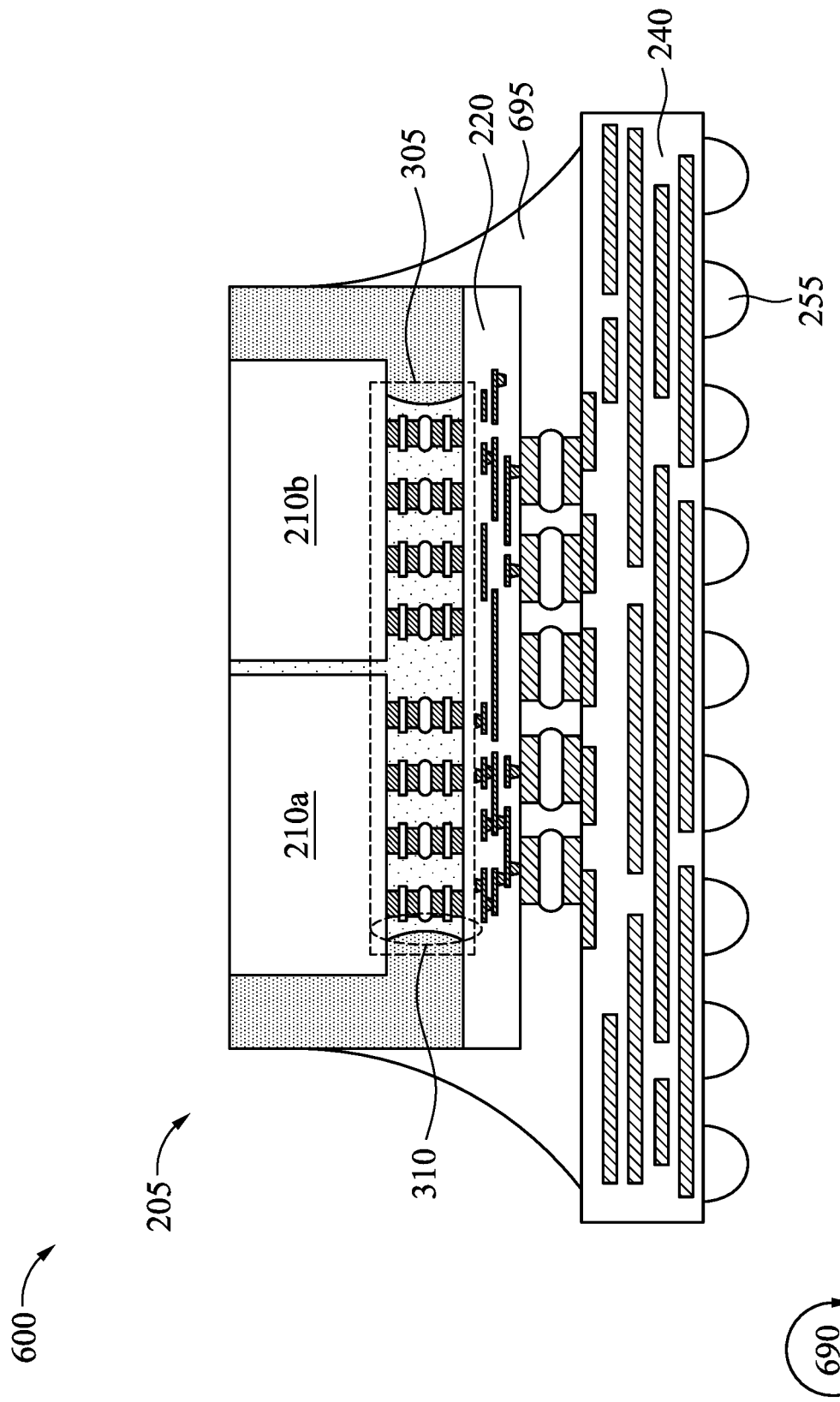

As shown in FIG. 6L, one or more tools of a semiconductor processing tool set (e.g., the dispense tool of the encapsulation tool set 135, among other examples) may perform a series of operations 690 as part of forming the semiconductor package 205. The series of operations 690 may include the dispense tool dispensing an encapsulant 695 over the substrate 240 and around the connection structures 250. In some implementations, the encapsulant 695 corresponds to an underfill material.

As shown in the structure of FIG. 6L, the semiconductor package 205 includes the interposer 220 and IC dies (e.g., the SoC IC die 210*a* and the SoC IC die 210*b*). The IC dies are electrically connected to the interposer 220 using a set of connection structures (e.g., the connection structures 230). The set of connection structures are between the IC dies and the interposer 220. The semiconductor package 205 further includes the mold compound 235 over the IC dies, the interposer 220, and the set of connection structures. The semiconductor package 205 further includes the underfill pattern between the interposer 220 and the IC dies. The pattern of underfill material 305 includes the shaped fillet 310 completely below the bottom surface of the IC dies.

The operations provided by FIGS. 6A-6L are provided as examples. In practice, there may be additional operations, different operations, or differently arranged operations than those shown in FIGS. 6A-6L.

Figure 7:
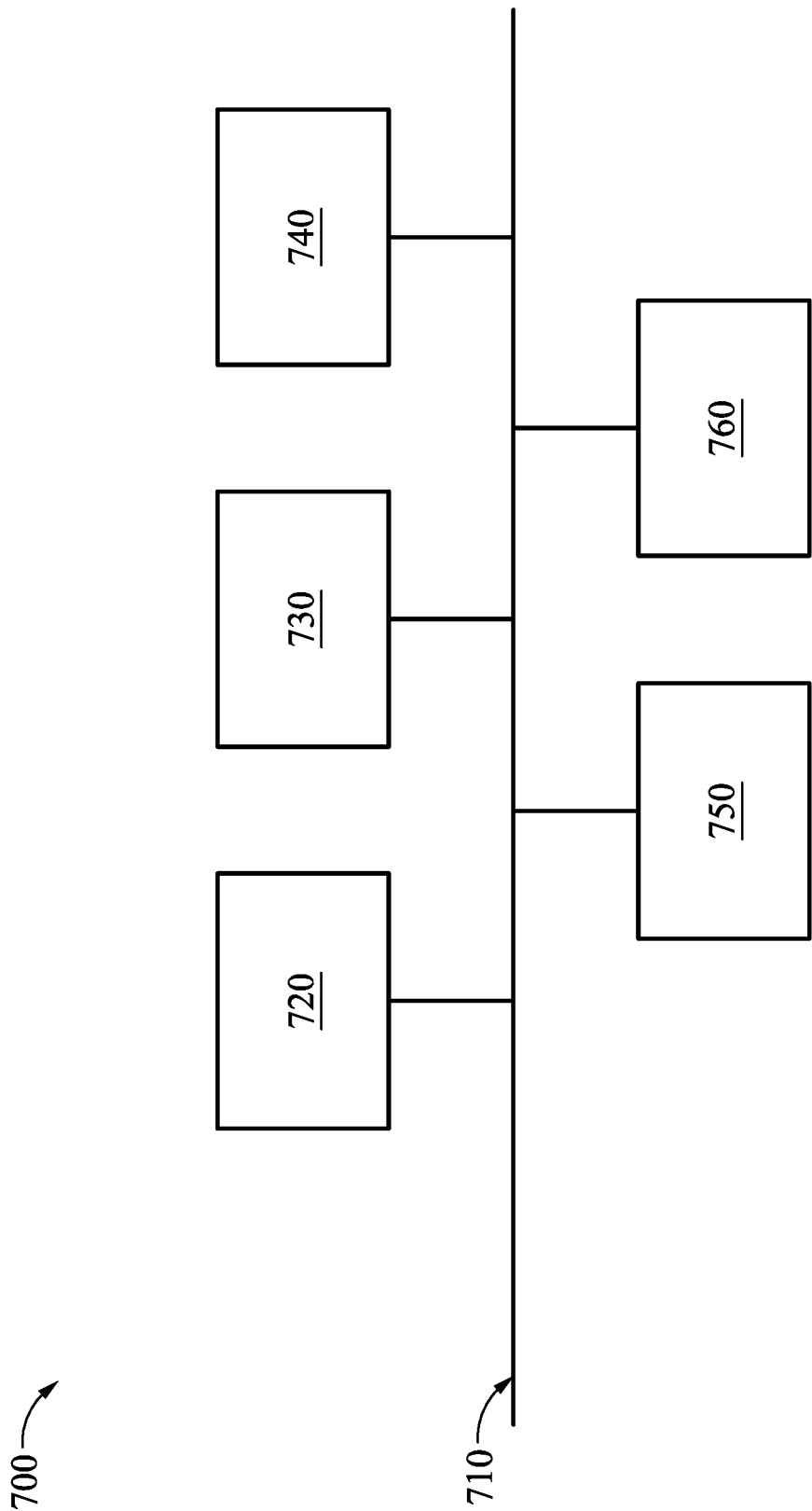
FIG. 7 is a diagram of example components of one or more devices of FIG. 1 described herein.

FIG. 7 is a diagram of example components of a device 700, which may correspond to one or more of the semiconductor processing tool sets 105-150. In some implementations, the semiconductor processing tool sets 105-150 include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
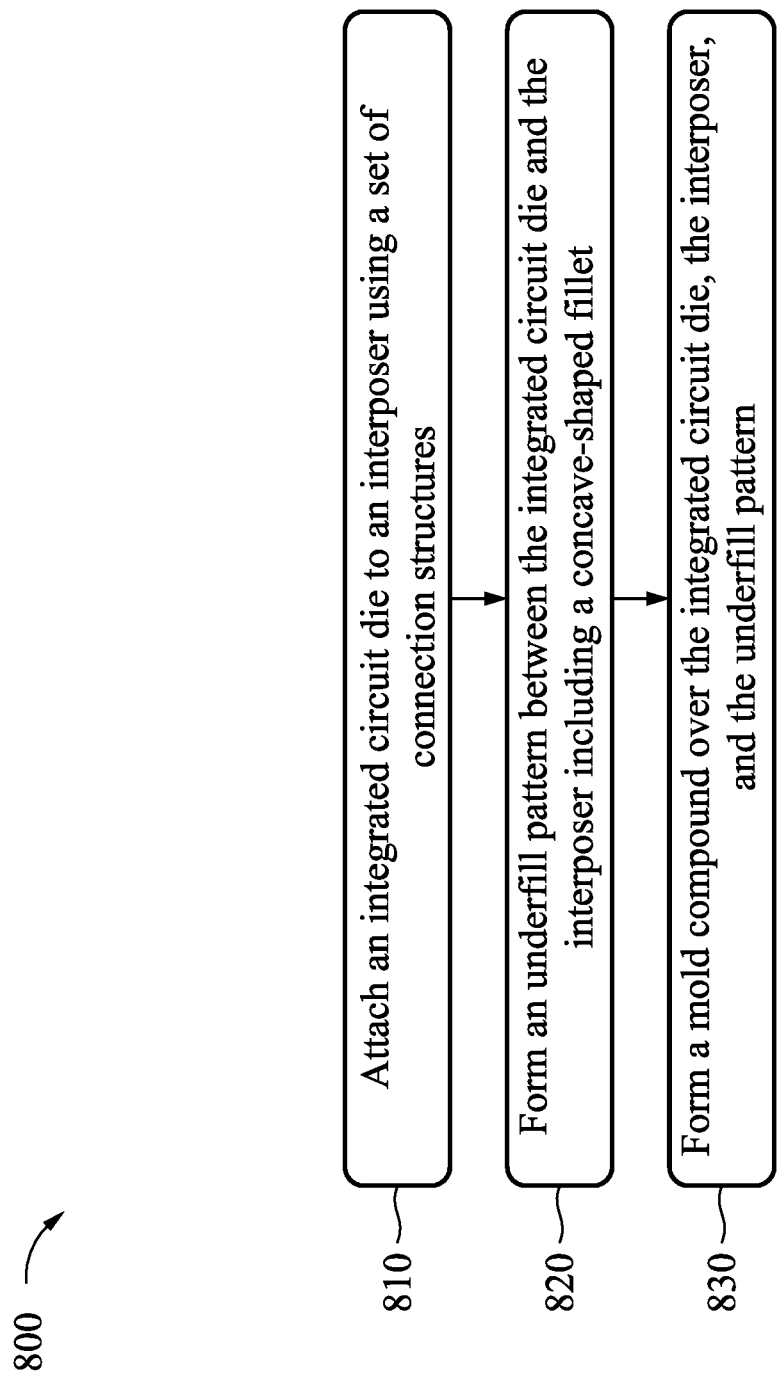
FIG. 8 is a flowchart of a process associated with forming a semiconductor package described herein.

FIG. 8 is a flowchart of an example process associated with forming a semiconductor package described herein. In some implementations, one or more process blocks of FIG. 8 are performed by one or more of the semiconductor processing tool sets 105-150. Additionally, or alternatively, one or more process blocks of FIG. 8 may be performed by one or more components of device 700, such as processor 720, memory 730, input component 740, output component 750, and/or communication component 760.

As shown in FIG. 8, process 800 may include attaching an integrated circuit die to an interposer using a set of connection structures (block 810). For example, one or more of the semiconductor processing tool sets 105-150, such as the die-attach tool set 130, may attach an IC die (e.g., the SoC IC die 210) to an interposer 220 using a set of connection structures (e.g., the connection structures 230), as described above.

As further shown in FIG. 8, process 800 may include forming an underfill pattern between the integrated circuit die and the interposer comprising a concave-shaped fillet (block 820). For example, one or more of the semiconductor processing tool sets 105-150, such as the dispense tool of encapsulation tool set 135, may form an underfill pattern between the integrated circuit die and the interposer 220 including a concave-shaped fillet (e.g., the fillet 310), as described above. In some implementations, the concave-shaped fillet is below a plane corresponding to a bottom surface of the integrated circuit die.

As further shown in FIG. 8, process 800 may include forming a mold compound over the integrated circuit die, the interposer, and the underfill pattern (block 830). For example, one or more of the semiconductor processing tool sets 105-150, such as a mold tool of the encapsulation tool set 135, may form a mold compound 235 over the integrated circuit die, the interposer, and the underfill pattern, as described above.

Process 800 may include additional implementations, such as any single implementation or any combination of implementations described below and/or in connection with one or more other processes described elsewhere herein.

In a first implementation, forming the underfill pattern includes performing a first dispense operation 620 that forms a first portion 625 of the underfill pattern around the set of connection structures, and performing a second dispense operation 630 that forms a second portion 635 of the underfill pattern adjacent to the set of connection structures. In some implementations, the second portion 635 of the underfill pattern includes the concave-shaped fillet.

In a second implementation, alone or in combination with the first implementation, performing the first dispense operation includes dispensing a first type of material, and performing the second dispense operation includes dispensing the first type of material.

In a third implementation, alone or in combination with one or more of the first and second implementations, performing the first dispense operation includes dispensing a first type of material, and performing the second dispense operation includes dispensing a second type of material that is other than the first type of material.

In a fourth implementation, alone or in combination with one or more of the first through third implementations, performing the second dispense operation includes dispensing a material that, in cured form, possesses a coefficient of thermal expansion that is included in a range of approximately 10 microns per meter Kelvin ($\mu$/m K) to approximately 50 $\mu$/m K, and wherein the material further possesses a Young's modulus that is included in a range of approximately 1 gigapascal (GPa) to approximately 20 gigapascals GPa.

In a fifth implementation, alone or in combination with one or more of the first through fourth implementations, process 800 includes bonding the interposer (e.g., the bonding tool of the RDL tool set 105 performing the bonding operation 605) to a temporary carrier (e.g., the first temporary carrier 610) prior to attaching the integrated circuit die to the interposer and prior to forming the underfill pattern.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations described herein provide a semiconductor package including an IC die mounted to an interposer using connection structures. An underfill material between the IC die and the interposer includes shaped fillets that are below a plane corresponding to a bottom surface of the IC die. The underfill material, including the shaped fillets that are the plane corresponding to the bottom surface of the IC die, reduces a likelihood of stresses and/or strains that damage a mold compound from transferring to the mold compound from the underfill material, the IC die, and/or the interposer.

In this way, a quality and reliability of the semiconductor package including the underfill material with the shaped fillets is reduced. By improving the quality and reliability of the semiconductor package, a yield of the semiconductor package may increase, which decreases a cost of the semiconductor package. Additionally, a qualification of the semiconductor package may be expedited to increase a market share of product including the semiconductor package.

As described in greater detail above, some implementations described herein provide a semiconductor package. The semiconductor package includes an interposer. The semiconductor package includes an IC die mechanically and/or electrically connected to the interposer using a set of connection structures between the IC die and the interposer. The semiconductor package includes a mold compound over the IC die, the interposer, and the set of connection structures. The semiconductor package includes an underfill pattern between the interposer and the IC die including a shaped fillet having a top surface at or below a plane corresponding to a bottom surface of the IC die.

As described in greater detail above, some implementations described herein provide a structure. The structure includes an interposer. The structure includes a first IC die and a second IC die adjacent to one another on the interposer and having edges that form an approximately rectangular perimeter. The structure includes a pattern of an underfill material including segments of shaped fillets along the approximately rectangular perimeter. In some implementations, the segments of the shaped fillets include portions that protrude beyond the approximately rectangular perimeter. In some implementations, the segments of the shaped fillets include top surfaces that are at or below a first plane corresponding to a bottom surface of the first IC die and a second plane corresponding to a bottom surface of the second IC die. In some implementations, the segments of the shaped fillets exclude top surfaces that are above the first plane corresponding to the bottom surface of the first IC die and the second plane corresponding to the bottom surface of the second IC die.

As described in greater detail above, some implementations described herein provide a method. The method includes attaching an IC die to an interposer using a set of connection structures. The method includes forming an underfill pattern between the IC die and the interposer including a concave-shaped fillet, where the concave-shaped fillet completely below a plane corresponding to a bottom surface of the IC die. The method includes forming a mold compound over the IC die, the interposer, and the underfill pattern.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   an interposer;
   an integrated circuit die mechanically and/or electrically connected to the interposer using a set of connection structures between the integrated circuit die and the interposer;
   a mold compound over the integrated circuit die, the interposer, and the set of connection structures; and
   an underfill pattern between the interposer and the integrated circuit die comprising:
      a shaped fillet having a top surface at or below a plane corresponding to a bottom surface of the integrated circuit die,
         wherein the shaped fillet comprises a curvature that intersects a portion of the bottom surface of the integrated circuit die at a distance from a bottom cornered edge of the integrated circuit die,
         wherein a segment of the shaped fillet includes a portion that protrudes beyond a perimeter of the integrated circuit die, and
         wherein the segment of the shaped fillet has a top surface at or below the plane corresponding to the bottom surface of the integrated circuit die.

2. The semiconductor package of claim 1, wherein the shaped fillet comprises:
   a height that is lesser than or equal to a distance between the bottom surface of the integrated circuit die and a top surface of the interposer.

3. The semiconductor package of claim 1, wherein the shaped fillet comprises:
   a concave surface extending towards the set of connection structures.

4. A structure, comprising:
   an interposer;
   a first integrated circuit die and a second integrated circuit die adjacent to one another on the interposer and having edges that form an approximately rectangular perimeter; and
   a pattern of an underfill material comprising segments of shaped fillets along the approximately rectangular perimeter,
      wherein the segments of the shaped fillets include portions that protrude beyond the approximately rectangular perimeter,
      wherein the segments of the shaped fillets include top surfaces that are at or below a first plane corresponding to a bottom surface of the first integrated circuit die and a second plane corresponding to a bottom surface of the second integrated circuit die, and
      wherein the segments of the shaped fillets exclude top surfaces that are above the first plane corresponding to the bottom surface of the first integrated circuit die and the second plane corresponding to the bottom surface of the second integrated circuit die.

5. The structure of claim 4, wherein the portions that protrude beyond the approximately rectangular perimeter comprise:
   midsegments along middle regions of first opposing sides of the approximately rectangular perimeter that are located adjacent to opposing ends of adjacent, mutually-facing regions of the first integrated circuit die and the second integrated circuit die, and
   corner segments along corner regions of the approximately rectangular perimeter, and
   wherein the portions that protrude beyond the approximately rectangular perimeter exclude:
      other segments along the approximately rectangular perimeter between the corner segments and the midsegments, and
      other segments along the approximately rectangular perimeter between the corner segments and along second opposing sides of the approximately rectangular perimeter.

6. The structure of claim 4, wherein the portions that protrude beyond the approximately rectangular perimeter comprise:

corner segments along corner regions of the approximately rectangular perimeter, and
wherein the segments of the shaped fillets exclude:
other segments along the approximately rectangular perimeter between the corner segments.

7. The structure of claim 4, wherein the portions that protrude beyond the approximately rectangular perimeter comprise:
linear segments along outer facing regions of the first integrated circuit die and the second integrated circuit die, and
midsegments along middle regions of first opposing sides of the approximately rectangular perimeter that are located adjacent to opposing ends of adjacent, mutually-facing regions of the first integrated circuit die and the second integrated circuit die,
wherein the segments of the shaped fillets exclude:
other segments along corner regions of the approximately rectangular perimeter.

8. The structure of claim 4, wherein the portions that protrude beyond the approximately rectangular perimeter comprise:
linear segments along outer facing regions of the first integrated circuit die and the second integrated circuit die, and
wherein the portions that protrude beyond the approximately rectangular perimeter exclude:
other segments along middle regions of first opposing sides of the approximately rectangular perimeter that are located adjacent to opposing ends of adjacent, mutually-facing regions of the first integrated circuit die and the second integrated circuit die, and
other segments along corner regions of the approximately rectangular perimeter.

9. The structure of claim 4, wherein the portions that protrude beyond the approximately rectangular perimeter comprise:
midsegments along middle regions of opposing sides of the approximately rectangular perimeter that are located adjacent to opposing ends of adjacent, mutually-facing regions of the first integrated circuit die and the second integrated circuit die, and
wherein the portions that protrude beyond the approximately rectangular perimeter exclude:
other segments along outer facing regions of the first integrated circuit die and the second integrated circuit die, and
other segments along corner regions of the approximately rectangular perimeter.

10. The structure of claim 4, wherein the segments of the shaped fillets further include:
portions that are retracted within the approximately rectangular perimeter.

11. The structure of claim 4, wherein the segments of the shaped fillets comprise:
segments having different shapes.

12. A method, comprising:
attaching an integrated circuit die to an interposer using a set of connection structures;
forming an underfill pattern, between the integrated circuit die and the interposer, comprising a concave-shaped fillet,
wherein the concave-shaped fillet is completely below a plane corresponding to a bottom surface of the integrated circuit die,
wherein the concave-shaped fillet comprises a curvature that intersects a portion of the bottom surface of the integrated circuit die at a distance from a bottom cornered edge of the integrated circuit die, and
wherein forming the underfill pattern includes:
performing a first dispense operation that forms a first portion of the underfill pattern around the set of connection structures, and
performing a second dispense operation that forms a second portion of the underfill pattern adjacent to the set of connection structures,
wherein the second portion of the underfill pattern includes the concave-shaped fillet; and
forming a mold compound over the integrated circuit die, the interposer, and the underfill pattern.

13. The method of claim 12, wherein performing the first dispense operation includes dispensing a first type of material, and
wherein performing the second dispense operation includes dispensing the first type of material.

14. The method of claim 12, wherein performing the first dispense operation includes dispensing a first type of material, and
wherein performing the second dispense operation includes dispensing a second type of material that is other than the first type of material.

15. The method of claim 12, wherein performing the second dispense operation includes dispensing a material that, in cured form, possesses a coefficient of thermal expansion that is included in a range of approximately 10 microns per meter Kelvin (µ/m K) to approximately 50 µ/m K, and
wherein the material further possesses a Young's modulus that is included in a range of approximately 1 gigapascal (GPa) to approximately 20 gigapascals GPa.

16. The method of claim 12, further comprising:
bonding the interposer to a temporary carrier prior to attaching the integrated circuit die to the interposer and prior to forming the underfill pattern.

17. The semiconductor package of claim 1, wherein the distance is up to approximately 200 µm.

18. The semiconductor package of claim 1, wherein an apex of the shaped fillet is located up to 200 µm from the bottom cornered edge of the integrated circuit die.

19. The method of claim 12, wherein the distance is up to approximately 200 µm.

20. The structure of claim 4, wherein the segments of the shaped fillets include segments having one or more of a concave shape or a triangular shape.

* * * * *